(12) United States Patent
Chang et al.

(10) Patent No.: US 12,045,423 B2
(45) Date of Patent: Jul. 23, 2024

(54) DISPLAY DEVICE

(71) Applicant: LG Display Co., Ltd., Seoul (KR)

(72) Inventors: Sujin Chang, Paju-si (KR); Jisu Yoon, Paju-si (KR); JinRyun Kim, Paju-si (KR); JeBeom Park, Paju-si (KR); Kyuhwan Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/070,984

(22) Filed: Nov. 29, 2022

(65) Prior Publication Data

US 2023/0214067 A1 Jul. 6, 2023

(30) Foreign Application Priority Data

Dec. 31, 2021 (KR) ................. 10-2021-0194692

(51) Int. Cl.
*G06F 3/044* (2006.01)
*H10K 50/84* (2023.01)
*H10K 50/86* (2023.01)

(52) U.S. Cl.
CPC .......... *G06F 3/0443* (2019.05); *H10K 50/84* (2023.02); *H10K 50/865* (2023.02)

(58) Field of Classification Search
None
See application file for complete search history.

(56) References Cited

U.S. PATENT DOCUMENTS

2023/0157103 A1* 5/2023 Lee ................. H10K 59/121
257/211

* cited by examiner

*Primary Examiner* — Duane N Taylor, Jr.
(74) *Attorney, Agent, or Firm* — Fenwick & West LLP

(57) ABSTRACT

The present disclosure provides a display device including a substrate, an encapsulation layer over the substrate, a touch sensor layer on the encapsulation layer and including a plurality of touch sensors, and a transmittance control layer on or under the touch sensor layer.

16 Claims, 22 Drawing Sheets

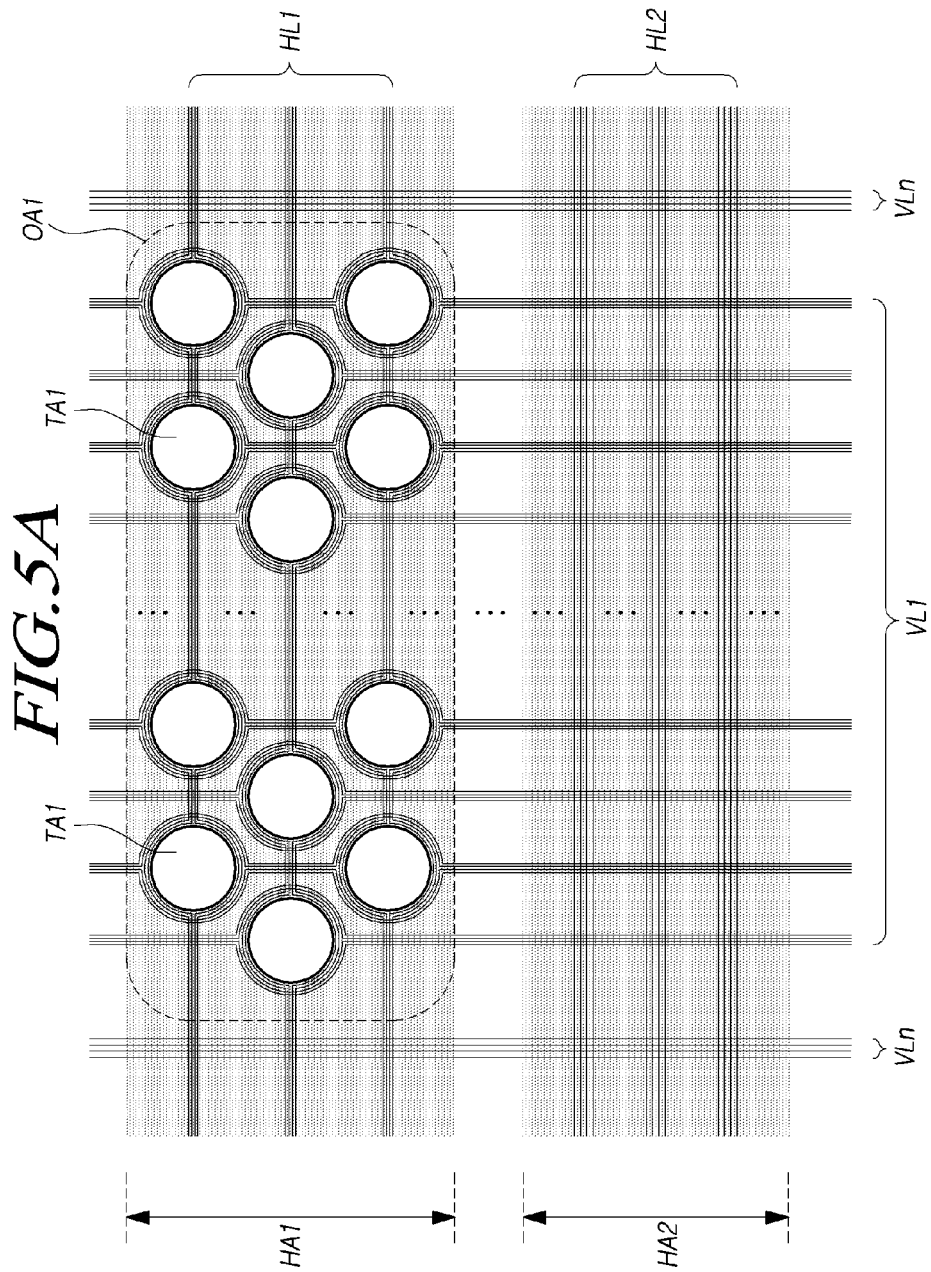

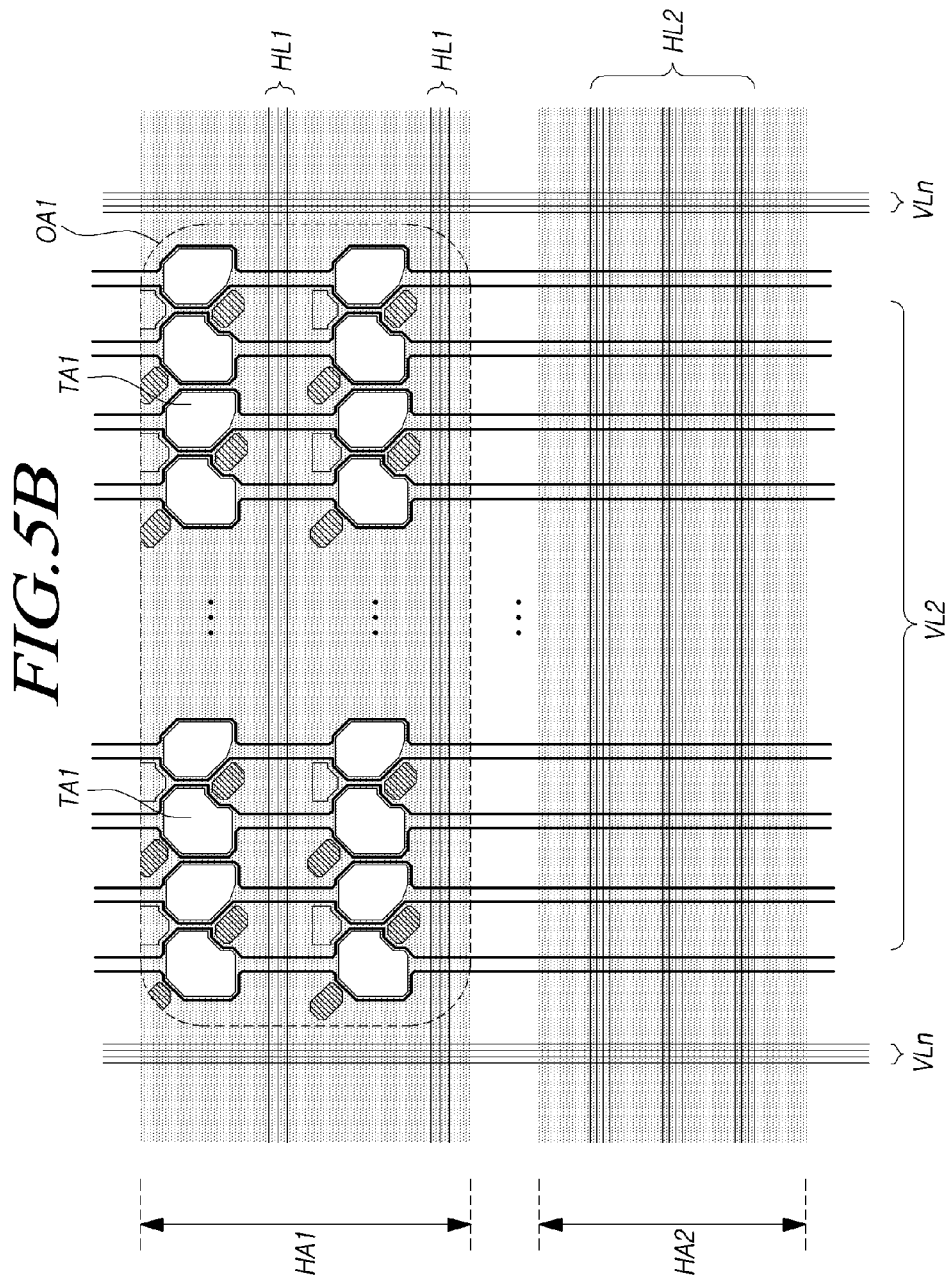

DISPLAY DEVICE

CROSS-REFERENCE TO RELATED APPLICATION

This application claims the priority benefit of Republic of Korea Patent Application No. 10-2021-0194692, filed on Dec. 31, 2021, in the Korean Intellectual Property Office, which is hereby incorporated by reference in its entirety.

TECHNICAL FIELD

The present disclosure relates to electronic devices, and more specifically, to a display device.

DESCRIPTION OF THE RELATED ART

As the information-oriented society has been developed, various needs for display devices for displaying an image have increased. To satisfy such needs, various types of display devices, such as a liquid crystal display (LCD) device, an electroluminescence display (ELD) device, and the like have been developed and utilized.

The ELD device may include a quantum-dot light emitting display device including a quantum dot (QD), an inorganic light emitting display device, and an organic light emitting display device, and the like.

Among these display devices, the ELD device has characteristics of a short response time, a wide viewing angle, excellent color gamut, and the like. Further, the ELD device has an advantage that can be implemented in a thin package or structure.

In the field of display technology, techniques for improving luminous efficiency and image quality of a display device have been developed.

SUMMARY

In spite of such development, challenges arise in improving the image quality of a display device as the display device has a high reflectance. Attempts to locate a polarizing plate have been made to improve the image quality by reducing the reflectance. In turn, such application of the polarizing plate has caused a decrease in luminous efficiency due to a low front transmittance, and in particular, has caused the problem of lowering transmittance in implementing an under-display camera (UDC) technique in display devices.

To address these issues, a display device capable of improving image quality by controlling transmittance according to red, blue and green wavelength regions in such a manner as to increase respective transmittance in the blue light region and the red light region to improve light transmittance, and to reduce transmittance in the green light region to reduce reflectance, by including a transmittance control layer on or under a touch sensor layer in order to control the transmittance of light emitted from a light source is disclosed.

One or more embodiments of the present disclosure may provide a display device capable of improving image quality by controlling transmittance according to red, blue and green wavelength regions in such a manner as to increase respective transmittance in the blue light region and the red light region to improve light transmittance, and to reduce transmittance in the green light region to reduce reflectance.

According to aspects of the present disclosure, a display device is provided that includes a substrate, an encapsulation layer disposed over the substrate, a touch sensor layer disposed on the encapsulation layer and including a plurality of touch sensors, and a transmittance control layer disposed on or under the touch sensor layer.

According to one or more embodiments of the present disclosure, a display device can be provided that is capable of improving image quality by controlling transmittance according to red, blue and green wavelength regions in such a manner as to increase respective transmittance in the blue light region and the red light region to improve light transmittance, and to reduce transmittance in the green light region to reduce reflectance.

According to one or more embodiments of the present disclosure, a display device can be provided that is capable of improving image quality through a reduced reflectance by implementing both a black matrix and a transmittance control layer.

According to one or more embodiments of the present disclosure, a display device can be provided that is capable of improving luminous efficiency and image quality even when a polarization layer is removed from the display device.

According to one or more embodiments of the present disclosure, a display device can be provided that is capable of improving flexibility by applying a transmittance control layer thinner than a polarization layer, According to one or more embodiments of the present disclosure, a display device can be provided that is capable of improving luminous efficiency and image quality and reducing a driving voltage.

According to one or more embodiments of the present disclosure, a display device can be provided that is capable of improving the transmittance of an area in which a camera is located under a display area of the display device.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 5A illustrates example arrangements of signal lines in each of the first optical area and a normal area in the display panel according to embodiments of the present disclosure;

FIG. 5B illustrates example arrangements of signal lines in each of a second optical area and the normal area in the display panel according to embodiments of the present disclosure;

DETAILED DESCRIPTION

Figure 1A:
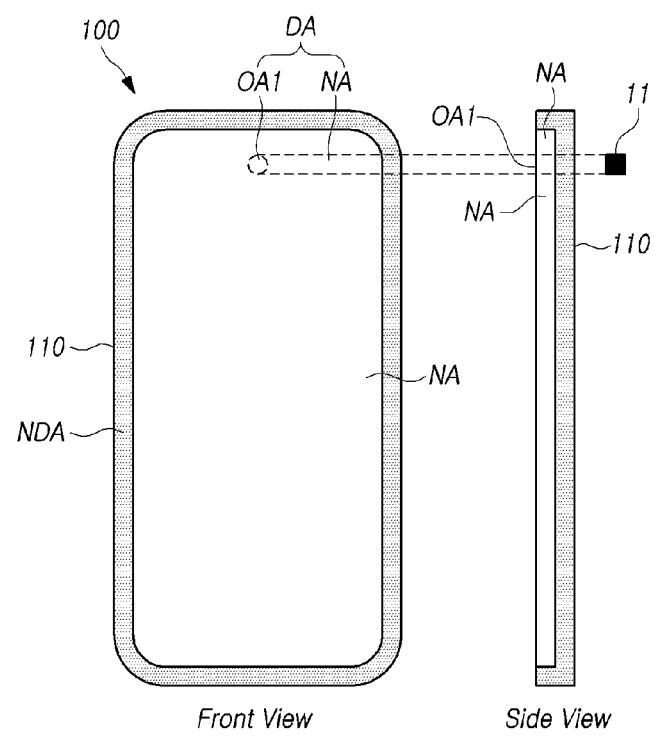
FIGS. 1A, 1B and 1C are plan views illustrating an example display device according to embodiments of the present disclosure.

Reference will now be made in detail to embodiments of the present disclosure, examples of which may be illustrated in the accompanying drawings. In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," "A", "B", "(a)", or "(b)", and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. Further, another element may be included in one or more of the two or more elements connected, combined, coupled, or contacted (to) one another.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference. In describing a temporal relationship, when the temporal order is described as, for example, "after," "subsequent," "next," or "before," a case which is not continuous may be included unless a more limiting term, such as "just," "immediate(ly)," or "direct(ly)," is used.

In construing an element, the element is to be construed as including an error or tolerance range even where no explicit description of such an error or tolerance range is provided. Further, the term "may" fully encompasses all the meanings of the term "can". The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element. The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C. Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Figure 1B:
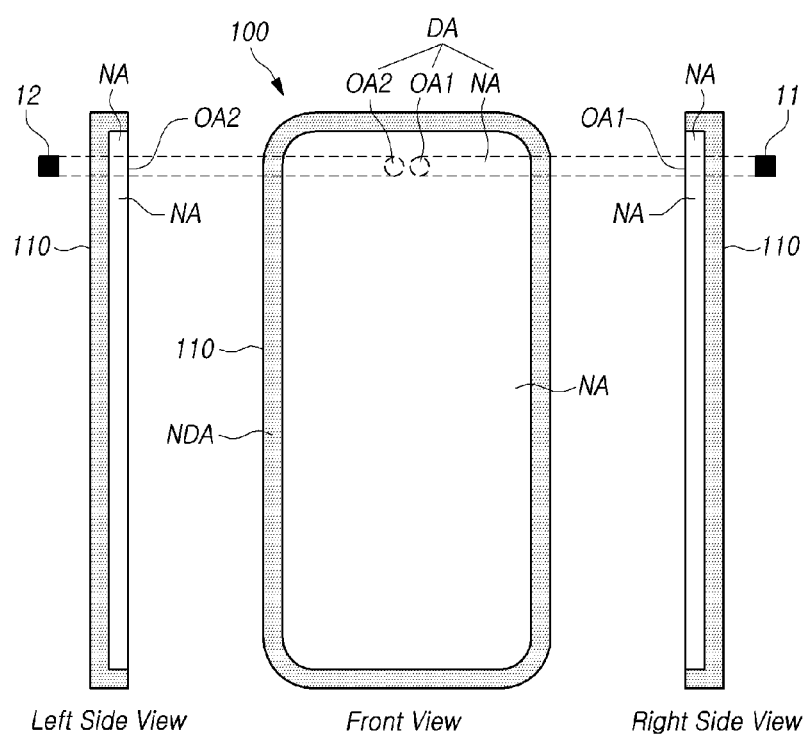
Figure 1C:
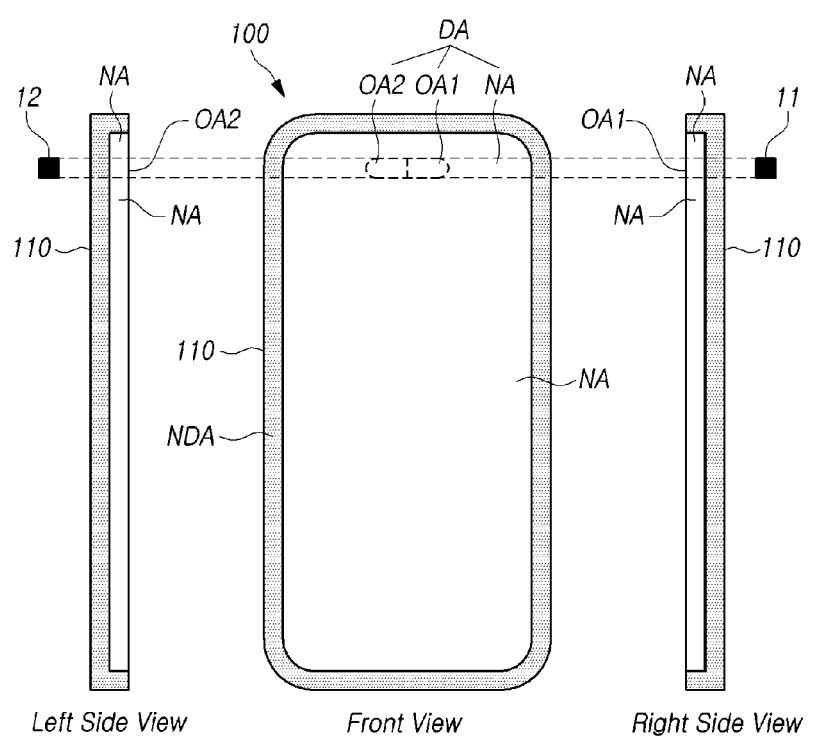

FIGS. 1A, 1B and 1C are plan views illustrating an example display device according to embodiments of the present disclosure.

Referring to FIGS. 1A, 1B, and 1C, a display device 100 according to aspects of the present disclosure may include a display panel 110 for displaying an image, and one or more optical electronic devices (11 and/or 12). Herein, an optical electronic device may be referred to as a light detector, a light receiver, or a light sensing device. An optical electronic device may include one or more of a camera, a camera lens, a sensor, a sensor for detecting images, or the like.

The display panel 110 may include a display area DA in which an image is displayed and a non-display area NDA in which an image is not displayed.

A plurality of pixels can be arranged in the display area DA, and several types of signal lines for driving the plurality of pixels can be arranged therein.

The non-display area NDA may refer to an area outside of the display area DA. Several types of signal lines may be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

Referring to FIGS. 1A, 1B, and 1C, in the display device 100 according to embodiments of the present disclosure, the one or more optical electronic devices (11 and/or 12) may be located under, or in a lower portion of, the display panel 110 (an opposite side to the viewing surface thereof).

Light can enter the front surface (viewing surface) of the display panel 110, pass through the display panel 110, reach one or more optical electronic devices (11 and/or 12) located under, or in the lower portion of, the display panel 110 (the opposite side of the viewing surface).

The one or more optical electronic devices (11 and/or 12) can receive or detect light transmitting through the display panel 110 and perform a predefined function based on the received light. For example, the one or more optical electronic devices (11 and/or 12) may include one or more of the following: an image capture device such as a camera (an image sensor), and/or the like; or a sensor such as a proximity sensor, an illuminance sensor, and/or the like.

Referring to FIGS. 1A, 1B, and 1C, in the display panel 110 according to embodiments of the present disclosure, the display area DA may include one or more optical areas (OA1 and/or OA2) and a normal area NA. Herein, the term "normal area" NA is an area that while being present in the display area DA, does not overlap with one or more optical electronic devices (11 and/or 12) and may also be referred to as a non-optical area.

Referring to FIGS. 1A, 1B, and 1C, the one or more optical areas (OA1 and/or OA2) may be one or more areas overlapping the one or more optical electronic devices (11 and/or 12).

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include an optical area OA, and a normal area NA. For example, the optical area OA may include a first optical area OA1 and a second optical area OA2. The normal area NA may be present between the first optical area OA1 and the second optical area OA2. In this example, at least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In some embodiments, an image display structure and a light transmission structure are desirable to be formed in the one or more optical areas (OA1 and/or OA2). For example, since the one or more optical areas (OA1 and/or OA2) are a portion of the display area DA, therefore, pixels for displaying an image are needed to be disposed in the one or more optical areas (OA1 and/or OA2). Further, to enable light to transmit the one or more optical electronic devices (11 and/or 12), a light transmission structure is needed, and thus is formed in the one or more optical areas (OA1 and/or OA2).

Even though the one or more optical electronic devices (11 and/or 12) are needed to receive or detect light, the one or more optical electronic devices (11 and/or 12) may be located on the back of the display panel 110 (e.g., on an opposite side of a viewing surface). In this embodiment, the one or more optical electronic devices (11 and/or 12) are located, for example, under, or in a lower portion of, the display panel 110, and is configured to receive light that has transmitted the display panel 110.

For example, the one or more optical electronic devices (11 and/or 12) are not exposed in the front surface (viewing surface) of the display panel 110. Accordingly, when a user faces the front surface of the display device 100, the one or more optical electronic devices (11 and/or 12) are located so that they are invisible to the user.

In one embodiment, the first optical electronic device 11 may be a camera, and the second optical electronic device 12 may be a sensor such as a proximity sensor, an illuminance sensor, an infrared sensor, and/or the like. For example, the camera may be a camera lens, an image sensor, or a unit including at least one of the camera lens and the image sensor. The sensor may be, for example, an infrared sensor capable of detecting infrared rays.

In another embodiment, the first optical electronic device 11 may be a sensor, and the second optical electronic device 12 may be a camera.

Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera may be a camera lens, an image sensor, or a unit including at least one of the camera lens and the image sensor.

In the example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

The first optical electronic device 11 can generate user information on a user viewing an image through the display device. The user information obtained by the first optical electronic device 11 may be, for example, an image obtained by capturing the user. The image obtained by capturing the user may include information on the face of the user. The first optical electronic device 11 may obtain a still image or a video image obtained by continuously capturing images.

Although the normal area NA and the one or more optical areas (OA1 and/or OA2) included in the display area DA in each of FIGS. 1A, 1B, and 1C are areas where images can be displayed, the normal area NA is an area where a light transmission structure need not be formed, but the one or more optical areas (OA1 and/or OA2) are areas where the light transmission structure need be formed. Thus, in some embodiments, the normal area NA is an area where a light transmission structure is not implemented or included, and the one or more optical areas (OA1 and/or OA2) are areas in which the light transmission structure is implemented or included.

Accordingly, the one or more optical areas (OA1 and/or OA2) may have a transmittance greater than or equal to a predetermined level, (e.g., a relatively high transmittance), and the normal area NA may not have light transmittance or have a transmittance less than the predetermined level (e.g., a relatively low transmittance).

For example, the one or more optical areas (OA1 and/or OA2) may have a resolution, a pixel arrangement structure, a number of pixels per unit area, an electrode structure, a line structure, an electrode arrangement structure, a line arrangement structure, or/and the like that is different from a resolution, a pixel arrangement structure, a number of pixels per unit area, an electrode structure, a line structure, an electrode arrangement structure, and/or a line arrangement structure of the normal area NA.

In an embodiment, the number of pixels per unit area in the one or more optical areas (OA1 and/or OA2) may be less than the number of pixels per unit area in the normal area NA. For example, the resolution of the one or more optical areas (OA1 and/or OA2) may be less than that of the normal area NA. Here, the number of pixels per unit area may be used as a unit for measuring resolution, and measured using pixels per inch (PPI), which represents the number of pixels within 1 inch.

In an embodiment, in each of FIGS. 1A to 1C, the number of pixels per unit area in the first optical area OA1 may be less than the number of pixels per unit area in the normal area NA. In an embodiment, in each of FIGS. 1B and 1C, the number of pixels per unit area in the second optical area OA2 may be greater than or equal to the number of pixels per unit area in the first optical area OA1.

In each of FIGS. 1A, 1B, and 1C, the first optical area OA1 may have various shapes, such as a circle, an ellipse, a quadrangle, a hexagon, an octagon or the like. In each of FIGS. 1B, and 1C, the second optical area OA2 may have various shapes, such as a circle, an ellipse, a quadrangle, a hexagon, an octagon or the like. The first optical area OA1 and the second optical area OA2 may have the same shape or different shapes.

In some embodiments, as a method for increasing a transmittance of at least one of the first optical area OA1 and the second optical area OA2, a technique (which may be referred to as a "pixel density differentiation design scheme") may be applied so that a density of pixels (or subpixels) or a degree of integration of pixels (or subpixels) can be differentiated as described above. According to the pixel density differentiation design scheme, in an embodiment, the display panel 110 may be configured or designed such that the number of pixels (or subpixels) per unit area of at least one of the first optical area OA1 and the second optical area OA2 is greater than the number of pixels (or subpixels) per unit area of the normal area NA.

In another embodiment, as another method for increasing a transmittance of at least one of the first optical area OA1 and the second optical area OA2, another technique (which may be referred to as a "pixel size differentiation design scheme") may be applied so that a size of a pixel (or a subpixel) can be differentiated. According to the pixel size differentiation design scheme, the display panel 110 may be configured or designed such that the number of pixels (or subpixels) per unit area of at least one of the first optical area OA1 and the second optical area OA2 is equal to or similar to the number of pixels (or subpixels) per unit area of the normal area NA. However, a size of each pixel (or subpixel) (i.e., a size of a corresponding light emitting area) disposed in at least one of the first optical area OA1 and the second optical area OA2 is smaller than a size of each pixel (or subpixel) (i.e., a size of a corresponding light emitting area) disposed in the normal area NA.

Referring to FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be provided based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

In examples where the display device 100 according to aspects of the present disclosure has a structure in which the first optical electronic device 11 such as a camera, and the like is located under, or in a lower portion of, the display panel 110 without being exposed to the outside, such a display device 100 according to aspects of the present disclosure may be referred to as a display in which under-display camera (UDC) technology is implemented.

According to these examples, the display device 100 according to aspects of the present disclosure can have an advantage of preventing the size of the display area DA from being reduced because a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11 and/or 12) are located on the back of (e.g., under, or in a lower portion of) the display panel 110 of the display device 100 (e.g., hidden or not to be exposed to the outside), the one or more optical electronic devices (11 and/or 12) are needed to perform normal predefined functionalities, and thus, receive or detect light.

Further, in the display device 100 according to aspects of the present disclosure, although one or more optical electronic devices (11 and/or 12) are located on the back of (e.g., under, or in a lower portion of) the display panel 110 to be hidden and located to be overlap the display area DA, it is necessary for image display to be normally performed in the one or more optical areas (OA1 and/or OA2) overlapping the one or more optical electronic devices (11 and/or 12) in the display area DA. Thus, in one or more examples, even though one or more optical electronic devices (11 and/or 12)

are located on the back of the display panel, images can be displayed in a normal manner (e.g., without reduction in image quality) in the one or more optical areas (OA1 and/or OA2) overlapping the one or more optical electronic devices (11 and/or 12) in the display area DA.

Figure 2:
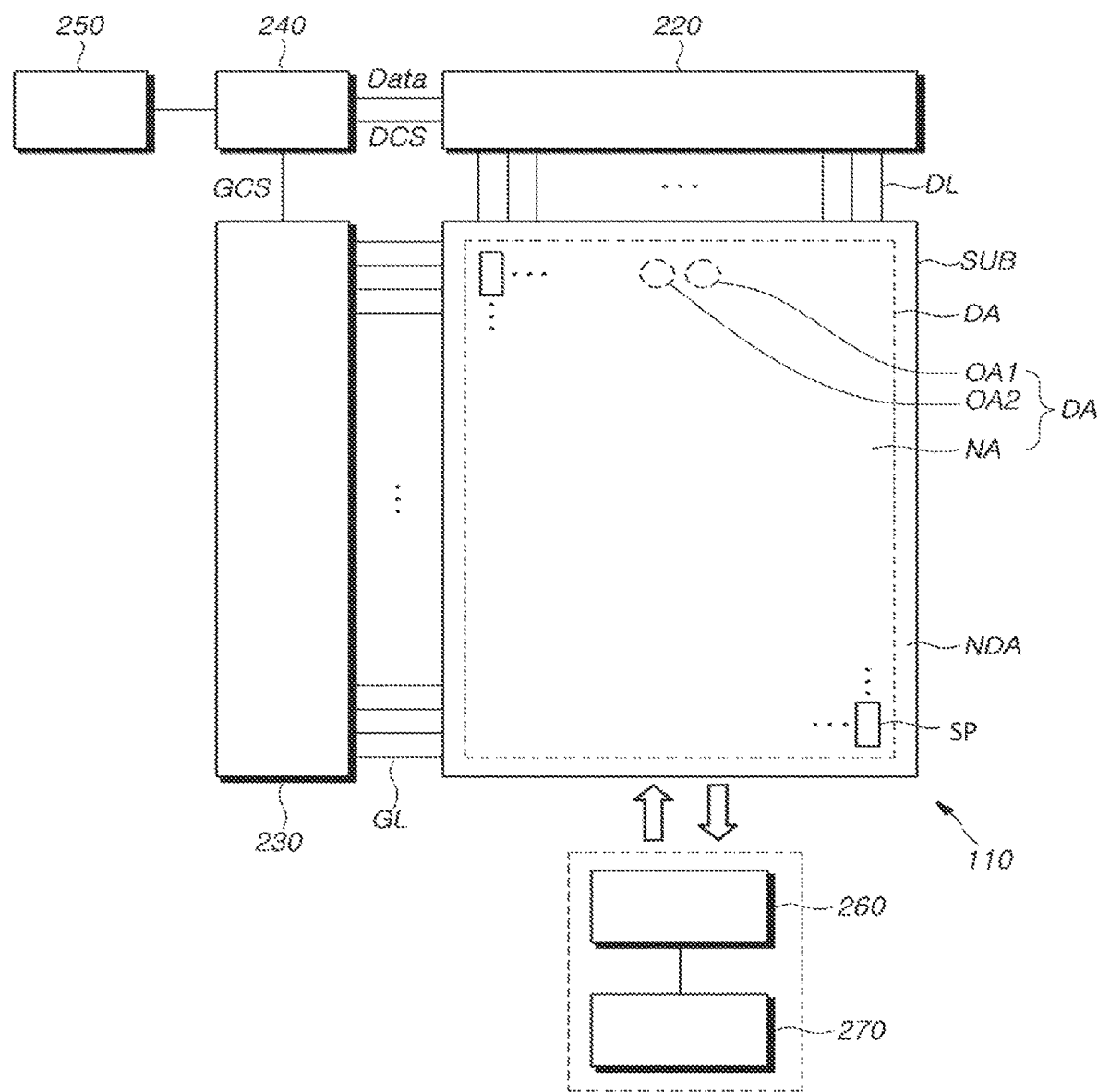
FIG. 2 illustrates an example system configuration of the display device according to embodiments of the present disclosure.

FIG. 2 illustrates an example system configuration of the display device 100 according to embodiments of the present disclosure.

Referring to FIG. 2, the display device 100 may include the display panel 110 and a display driving circuit as components for displaying an image.

The display driving circuit is a circuit for driving the display panel 110, and may include a data driving circuit 220, a gate driving circuit 230, a display controller 240, and other components.

The display panel 110 may include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 may include a substrate SUB and a plurality of pixels SP disposed on the substrate SUB. The display panel 110 may further include various types of signal lines to drive the plurality of pixels SP. Each of the plurality of pixels SP may include, for example, a red subpixel emitting red light, a green subpixel emitting green light, and a blue subpixel emitting blue light. Further, one pixel can express colors corresponding to respective luminance of the red subpixel, the green subpixel, and the blue subpixel.

In one embodiment, the display device 100 according to aspects of the present disclosure may be a liquid crystal display device. In another example, the display device 100 according to aspects of the present disclosure may be a self-emission display device in which pixels itself disposed in the display panel 110 thereof emit light. In the example where the display device 100 according to aspects of the present disclosure is the self-emission display device, each of the plurality of pixels SP may include a light emitting element.

In one embodiment, the display device 100 according to aspects of the present disclosure may be an organic light emitting display device in which the light emitting element is implemented using an organic light emitting diode (OLED). In another embodiment, the display device 100 according to aspects of the present disclosure may be an inorganic light emitting display device in which the light emitting element is implemented using an inorganic material-based light emitting diode. In further another embodiment, the display device 100 according to aspects of the present disclosure may be a quantum dot display device in which the light emitting element is implemented using quantum dots, which are self-emission semiconductor crystals.

The structure of each of the plurality of pixels SP may vary according to types of the display devices 100. In the example where the display device 100 is a self-emission display device including self-emission pixels SP, each pixel SP may include a self-emission light emitting element, one or more transistors, and one or more capacitors.

The various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction.

For example, the first direction may be a column or vertical direction, and the second direction may be a row or horizontal direction. In another example, the first direction may be the row direction, and the second direction may be the column direction.

The data driving circuit 220 is a circuit for driving the plurality of data lines DL, and can supply data signals to the plurality of data lines DL. The gate driving circuit 230 is a circuit for driving the plurality of gate lines GL, and can supply gate signals to the plurality of gate lines GL.

The display controller 240 may be a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can supply data signals to the plurality of data lines DL according to driving timing control of the display controller 240.

The data driving circuit 220 can receive the digital image data Data from the display controller 240, convert the received image data Data into analog data signals, and supply the resulting analog data signals to the plurality of data lines DL.

The gate driving circuit 230 can supply gate signals to the plurality of gate lines GL according to timing control of the display controller 240. The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. The gate driving circuit 230 may be connected to the substrate in the case of the chip on glass (COG) type, the chip on film (COF) type, or the like.

In some embodiments, at least one of the data driving circuit 220 and the gate driving circuit 230 may be disposed in the display area DA of the display panel 110. For example, at least one of the data driving circuit 220 and the gate driving circuit 230 may be disposed not to overlap pixels SP, or disposed to be overlapped with one or more, or all, of the pixels SP.

The data driving circuit 220 may also be located on, but not limited to, one side or portion (e.g., an upper edge or a lower edge) of the display panel 110. In some embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in one side or portion (e.g., a left edge or a right edge) of the display panel 110. In some embodiments, the gate driving circuit 230 may be connected to two sides or portions (e.g., a left edge and a right edge) of the panel 110, or be connected to at least two of four sides or portions (e.g., an upper edge, a lower edge, the left edge, and the right edge) of the panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In some embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like. In some embodiments, the display controller 240 may be an application processor (AP).

The display controller 240 may be mounted on a printed circuit board, a flexible printed circuit, and/or the like and be electrically connected to the gate driving circuit 230 and the data driving circuit 220 through the printed circuit board, flexible printed circuit, and/or the like.

The display controller 240 may transmit signals to, and receive signals from, the data driving circuit 220 via one or more predefined interfaces. In some embodiments, such interfaces may include a low voltage differential signaling (LVDS) interface, an embedded clock point-point interface (EPI), a serial peripheral interface (SPI), and the like.

In some embodiments, in order to further provide a touch sensing function, as well as an image display function, the display device 100 may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit may include a touch driving circuit 260 capable of generating and providing touch sensing data by driving and sensing the touch sensor, a touch controller 270 capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where the add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

In the example where the touch sensor is implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing method, each of the plurality of touch electrodes can serve as both a driving touch electrode and a sensing touch electrode. The touch driving circuit 260 can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

In some embodiments, the display device 100 may be a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel 110 may include a normal area NA and one or more optical areas (OA1 and/or OA2), for example, as illustrated in FIGS. 1A, 1B, and 1C.

The normal area NA and the one or more optical areas (OA1 and/or OA2) are areas where an image can be displayed. However, the normal NA is an area in which a light transmission structure need not be implemented, and the one or more optical areas (OA1 and/or OA2) are areas in which the light transmission structure need be implemented.

As discussed above with respect to the examples of FIGS. 1A, 1B, and 1C, although the display area DA of the display panel 110 may include the one or more optical areas (OA1 and/or OA2) in addition to the normal area NA, for convenience of description, in the discussion that follows, it is assumed that the display area DA includes first and second optical areas (OA1, OA2) and the normal area NA; and the normal area NA thereof includes the normal areas NAs in FIGS. 1A to 1C, and the first and second optical areas (OA1, OA2) thereof include the first optical areas OA1s in FIGS. 1A, 1B, and 1C and the second optical areas OA2s of FIGS. 1B and 1C, respectively, unless explicitly stated otherwise.

Figure 3:
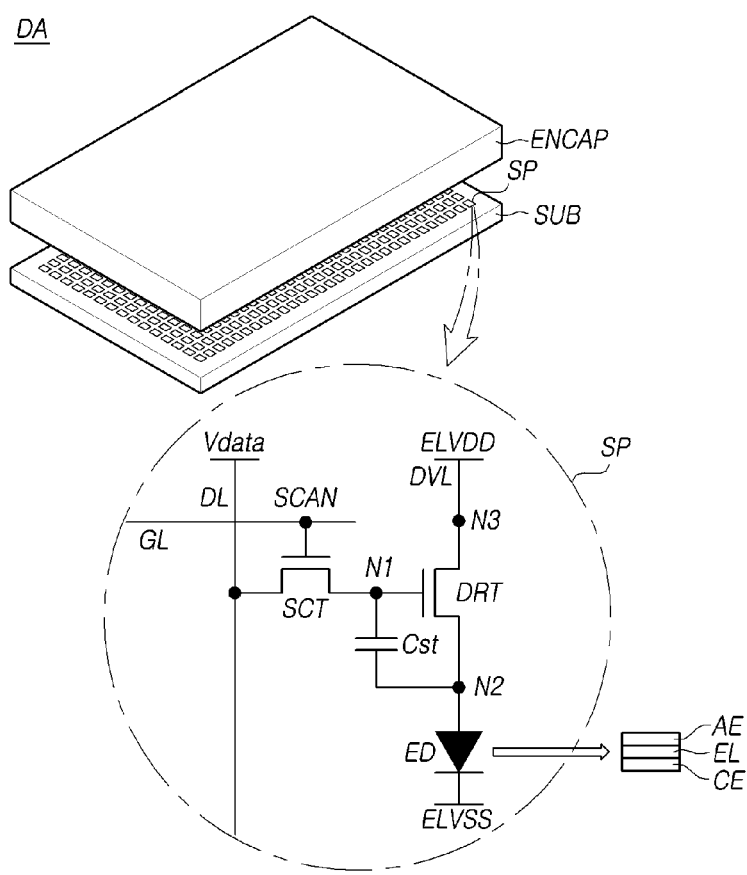
FIG. 3 illustrates an example equivalent circuit of a pixel in a display panel according to embodiments of the present disclosure.

FIG. 3 illustrates an example equivalent circuit of a subpixel SP in the display panel 110 according to embodiments of the present disclosure.

Each of subpixels SP disposed in the normal area NA, the first optical area OA1, and the second optical area OA2 included in the display area DA of the display panel 110 may include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT may include the first node N1 to which a data voltage is applied, a second node N2 electrically connected to the light emitting element ED, and a third node N3 to which a pixel driving voltage ELVDD through a driving voltage line DVL is applied. In the driving transistor DRT, the first node N1 may be a gate node, the second node N2 may be a source node or a drain node, and the third node N3 may be the drain node or the source node.

The light emitting element ED may include an anode electrode AE, an emission layer EL, and a cathode electrode CE. The anode electrode AE may be a pixel electrode disposed in each pixel (or subpixel) SP, and may be electrically connected to the second node N2 of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in discussions that follow, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In the example where an organic light emitting diode is used as the light emitting element ED, the emission layer EL included in the light emitting element ED may include an organic emission layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT.

Each subpixel SP may include two transistors (2T: DRT and SCT) and one capacitor (1C: Cst) (which may be referred to as a "2T1C structure") as illustrated in FIG. 3, and in some cases, may further include one or more transistors, or further include one or more capacitors.

In some embodiments, the storage capacitor Cst, which may be present between the first node N1 and the second node N2 of the driving transistor DRT, may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT may be an n-type transistor or a p-type transistor.

Since circuit elements (e.g., in particular, a light emitting element ED) in each subpixel SP are vulnerable to external moisture or oxygen, an encapsulation layer ENCAP may be disposed in the display panel 110 in order to prevent the external moisture or oxygen from penetrating into the circuit elements (e.g., in particular, the light emitting element ED). The encapsulation layer ENCAP may be disposed to cover the light emitting element ED.

Figure 4:
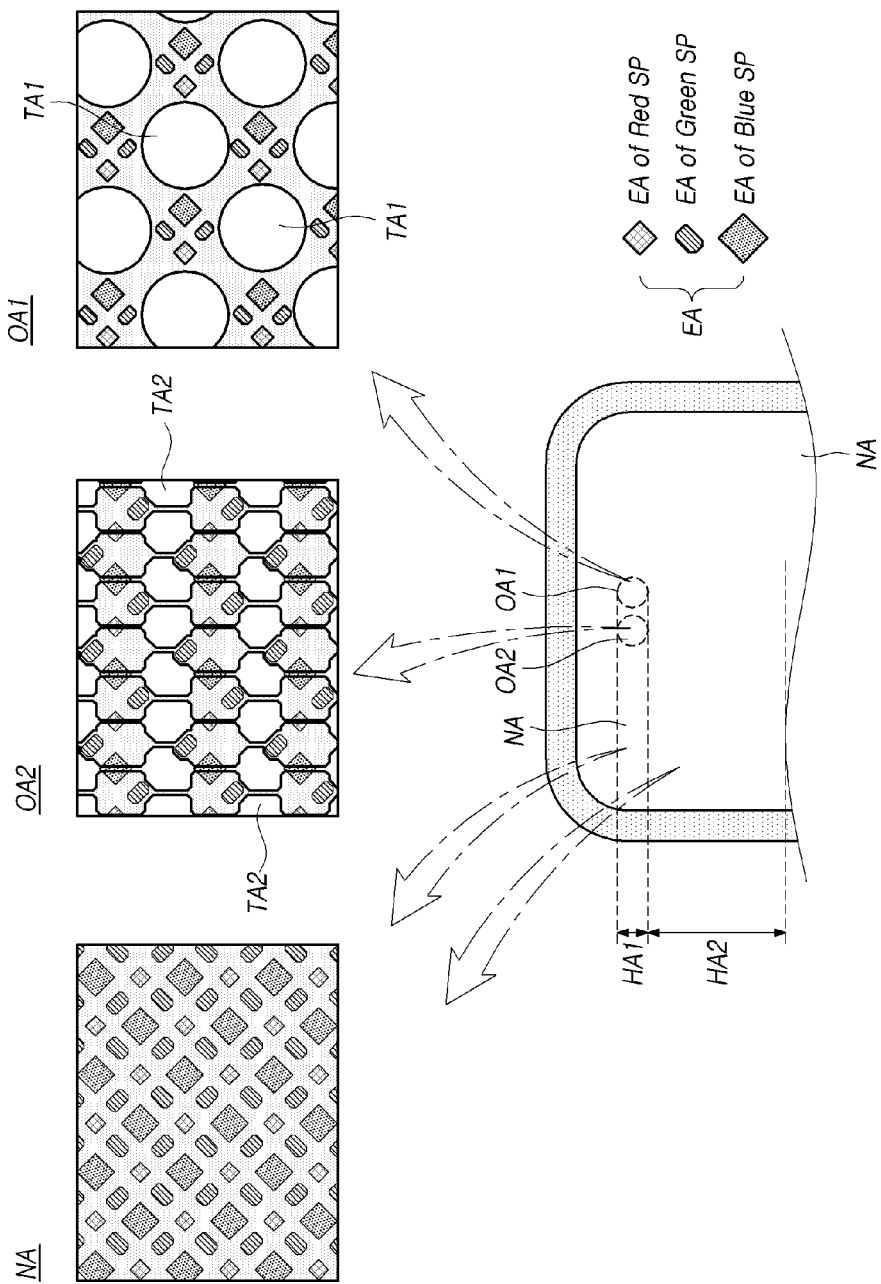
FIG. 4 illustrates example arrangements of pixels in three areas included in a display area of the display panel according to embodiments of the present disclosure.

FIG. 4 illustrates example arrangements of pixels SP in the three areas (NA, OA1, and OA2) included in the display area DA of the display panel 110 according to embodiments of the present disclosure.

Referring to FIG. 4, in some embodiments, a plurality of pixels SP may be disposed in each of the normal area NA, the first optical area OA1, and the second optical area OA2 included in the display area DA.

Each of the plurality of pixels SP may include, for example, a red subpixel (red SP) emitting red light, a green subpixel (green SP) emitting green light, and a blue subpixel (blue SP) emitting blue light.

Accordingly, each of the normal area NA, the first optical area OA1, and the second optical area OA2 may include one or more light emitting areas EA of one or more red subpixels (red SP), and one or more light emitting areas EA of one or more green subpixels (green SP), and one or more light emitting areas EA of one or more blue subpixels (blue SP).

Referring to FIG. 4, in some embodiments, the normal area NA may not include a light transmission structure, but may include light emitting areas EA.

In contrast, in some embodiments, the first optical area OA1 and the second optical area OA2 need to include both the light emitting areas EA and the light transmission structure.

Accordingly, the first optical area OA1 may include one or more light emitting areas EA and one or more first transmission areas TA1, and the second optical area OA2 may include one or more light emitting areas EA and one or more second transmission areas TA2.

The light emitting areas EA and the transmission areas (TA1 and/or TA2) may be distinct according to whether the transmission of light is allowed. For example, the light emitting areas EA may be areas not allowing light to transmit (e.g., not allowing light to transmit to the back of the display panel), and the transmission areas (TA1 and/or TA2) may be areas allowing light to transmit (e.g., allowing light to transmit to the back of the display panel).

The light emitting areas EA and the transmission areas (TA1 and/or TA2) may be also distinct according to whether or not a specific metal layer is included. For example, the cathode electrode CE as illustrated in FIG. 3 may be disposed in the light emitting areas EA, and the cathode electrode CE may not be disposed in the transmission areas (TA1 and/or TA2). In some embodiments, a light shield layer may be disposed in the light emitting areas EA, and a light shield layer may not be disposed in the transmission areas (TA1 and/or TA2).

Since the first optical area OA1 includes the first transmission areas TA1 and the second optical area OA2 includes the second transmission areas TA2, both of the first optical area OA1 and the second optical area OA2 are areas through which light can transmit.

In one embodiment, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have substantially the same shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 may be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 may be different.

For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 may be different from each other.

For example, in the example where the first optical electronic device 11, as illustrated in FIGS. 1A, 1B and 1C, overlapping the first optical area OA1 is a camera, and the second optical electronic device 12, as illustrated in FIGS. 1B and 1C, overlapping the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2.

For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 may be greater than a ratio of the second transmission area TA2 to the second optical area OA2.

For convenience of description, the discussion that follows is provided based on the embodiment in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal display area HA1, and another horizontal display area in which the first optical area OA1 and the second optical area OA2 are not disposed is referred to as a second horizontal display area HA2.

Referring to FIG. 4, the first horizontal display area HA1 may include a portion of the normal area NA, the first optical area OA1, and the second optical area OA2. The second horizontal display area HA2 may include only another portion of the normal area NA.

FIG. 5A illustrates example arrangements of signal lines in each of the first optical area OA1 and the normal area NA of the display panel 110 according to embodiments of the present disclosure, and FIG. 5B illustrates example arrangements of signal lines in each of the second optical area OA2 and the normal area NA of the display panel 110 according to aspects of the present disclosure.

First horizontal display areas HA1 shown in FIGS. 5A and 5B are portions of the first horizontal display area HA1 of the display panel 110. Second horizontal display area HA2 shown in FIGS. 5A and 5B are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

Referring to FIGS. 5A and 5B, the first horizontal display area HA1 may include a portion of the normal area NA, the first optical area OA1, and the second optical area OA2. The second horizontal display area HA2 may include another portion of the normal area NA.

Various types of horizontal lines (HL1 and HL2) and various types of vertical lines (VLn, VL1, and VL2) may be disposed in the display panel 110.

In some embodiments, the term "horizontal" and the term "vertical" are used to refer to two directions intersecting the display panel; however, it should be noted that the horizontal direction and the vertical direction may be changed depending on a viewing direction. The horizontal direction may refer to, for example, a direction in which one gate line GL extends and, and the vertical direction may refer to, for example, a direction in which one data line DL extends. As such, the term horizontal and the term vertical are used to represent two directions.

Referring to FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. That is, the first horizontal lines HL1 and the second horizontal lines HL2 may be the gate lines GL. The gate lines GL may include various types of gate lines according to structures of one or more pixels SP.

Referring to FIGS. 5A and 5B, the vertical lines disposed in the display panel 110 may include vertical lines VLn disposed only in the normal area NA, first vertical lines VL1 running through both of the first optical area OA1 and the normal area NA, and second vertical lines VL2 running through both of the second optical area OA2 and the normal area NA.

The vertical lines disposed in the display panel 110 may include data lines DL, driving voltage lines DVL, and the like, and may further include reference voltage lines, initialization voltage lines, and the like. That is, the normal vertical lines VLn, the first vertical lines VL1 and the second vertical lines VL2 may include data lines DL, driving voltage lines DVL, and the like, and further include reference voltage lines, initialization voltage lines, and the like.

In some embodiments, it should be noted that the term "horizontal" in the second horizontal line HL2 may mean that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 may include one or more bent or folded portions that are different from the configurations shown in FIGS. 5A and 5B. Likewise, one or more of the first horizontal lines HL1 may also include one or more bent or folded portions.

In some embodiments, it should be noted that the term "vertical" in the typical vertical line VLn may mean that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, one or more of the typical vertical lines VLn may include one or more bent or folded portions that are different from the configurations shown in FIGS. 5A and 5B. Likewise, one or more of the first vertical line VL1 and one or more of the second vertical line VL2 may also include one or more bent or folded portions.

Referring to FIG. 5A, the first optical area OA1 included in the first horizontal display area HA1 may include light emitting areas EA, as shown in FIG. 4, and first transmission areas TA1. In the first optical area OA1, respective outer areas of the first transmission areas TA1 may be included in light emitting areas EA.

Referring to FIG. 5A, in order to improve the transmittance of the first optical area OA1, the first horizontal lines HL1 may run through the first optical area OA1 while avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal display area HA1 and the second horizontal lines HL2 disposed in the second horizontal display area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run (e.g., extend) through the first optical area OA1 while avoiding the first transmission areas TA1 in the first optical area OA1.

Accordingly, each of the first vertical lines VL1 running through the first optical area OA1 may include one or more curved or bent portions running (e.g., extending) around one or more respective outer edges of one or more of the first transmission areas TA1.

Thus, the first vertical lines VL1 running through the first optical area OA1 and the normal vertical lines VLn disposed in the normal area NA without running through the first optical area OA1 may have different shapes or lengths.

Referring to FIG. 5A, the first transmission areas TA1 included in the first optical area OA1 in the first horizontal display area HA1 may be arranged in a diagonal direction.

Referring to FIG. 5A, in the first optical area OA1 in the first horizontal display area HAL one or more light emitting areas EA may be disposed between two horizontally adjacent first transmission areas TA1. In the first optical area OA1 in the first horizontal display area HAL one or more light emitting areas EA may be disposed between two first transmission areas TA1 adjacent to each other in up and down directions (e.g., two vertically-adjacent first transmission areas TA1).

Referring to FIG. 5A, each of the first horizontal lines HL1 disposed in the first horizontal display area HA1 (e.g., each of the first horizontal lines HL1 running through the first optical area OA1) may include one or more curved or bent portions running around one or more respective outer edges of one or more of the first transmission areas TA1.

Referring to FIG. 5B, the second optical area OA2 included in the first horizontal display area HA1 may include light emitting areas EA and second transmission areas TA2. In the second optical area OA2, respective outer areas of the second transmission areas TA2 may be included in light emitting areas EA.

In one embodiment, the light emitting areas EA and the second transmission areas TA2 in the second optical area OA2 may have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). In this example, a light emitting area EA may not be disposed between two second transmission areas TA2 adjacent to each other in left and right directions (e.g., the horizontal direction). Further, one or more of the light emitting areas EA in the second optical area OA2 may be disposed between second transmission areas TA2 adjacent to each other in up and down directions (e.g., the vertical direction). For example, one or more light emitting areas EA may be disposed between two rows of second transmission areas.

When in the first horizontal display area HAL the first horizontal lines HL1 run through the second optical area OA2 and the normal area NA adjacent to the second optical area OA2, in one embodiment, the first horizontal lines HL1 may have substantially the same arrangement as the first horizontal lines HL1 of FIG. 5A.

In another embodiment, as shown in FIG. 5B, when in the first horizontal display area HAL running through the second optical area OA2 and the normal area NA adjacent to the second optical area OA2, the first horizontal lines HL1 may have an arrangement different from the first horizontal lines HL1 of FIG. 5A.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal display area HAL the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run (e.g., extend) through the second optical area OA2 while avoiding the second transmission areas TA2 in the second optical area OA2.

Accordingly, each of the second vertical lines VL2 running (e.g., extending) through the second optical area OA2 may include one or more curved or bent portions running around one or more respective outer edges of one or more of the second transmission areas TA2.

Thus, the second vertical lines VL2 running through the second optical area OA2 and the normal vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2, which is referred to as a second resistance.

Referring to FIGS. 5A and 5B, according to an example light transmitting structure, the first optical area OA1 that at least partially overlaps the first optical electronic device 11 includes the first transmission areas TA1, and the second optical area OA2 that at least partially overlaps with the second optical electronic device 12 includes the second transmission areas TA2. Therefore, the number of pixels per unit area in each of the first optical area OA1 and the second optical area OA2 may be less than that of the normal area NA.

Accordingly, the number of pixels connected to each, or one or more, of the first horizontal lines HL1 running through the first optical area OA1 and the second optical area OA2 may be different from the number of pixels connected to each, or one or more, of the second horizontal lines HL2 disposed only in the normal area NA without running through the first optical area OA1 and the second optical area OA2.

The number of pixels connected to each, or one or more, of the first horizontal lines HL1 running through the first optical area OA1 and the second optical area OA2, which is referred to as a first number, may be less than the number of pixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of pixels connected to each, or one or more, of the first horizontal lines HL1 running through the first optical area OA1 and the second optical area OA2 is smaller than the number of pixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly less than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly less than an RC value of the second horizontal lines HL2 disposed only in the normal area NA without running through the first optical area OA1 and the second optical area OA2, which is referred to as a second RC value. Thus, in this example, the first RC value is greatly less than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

Figure 6:
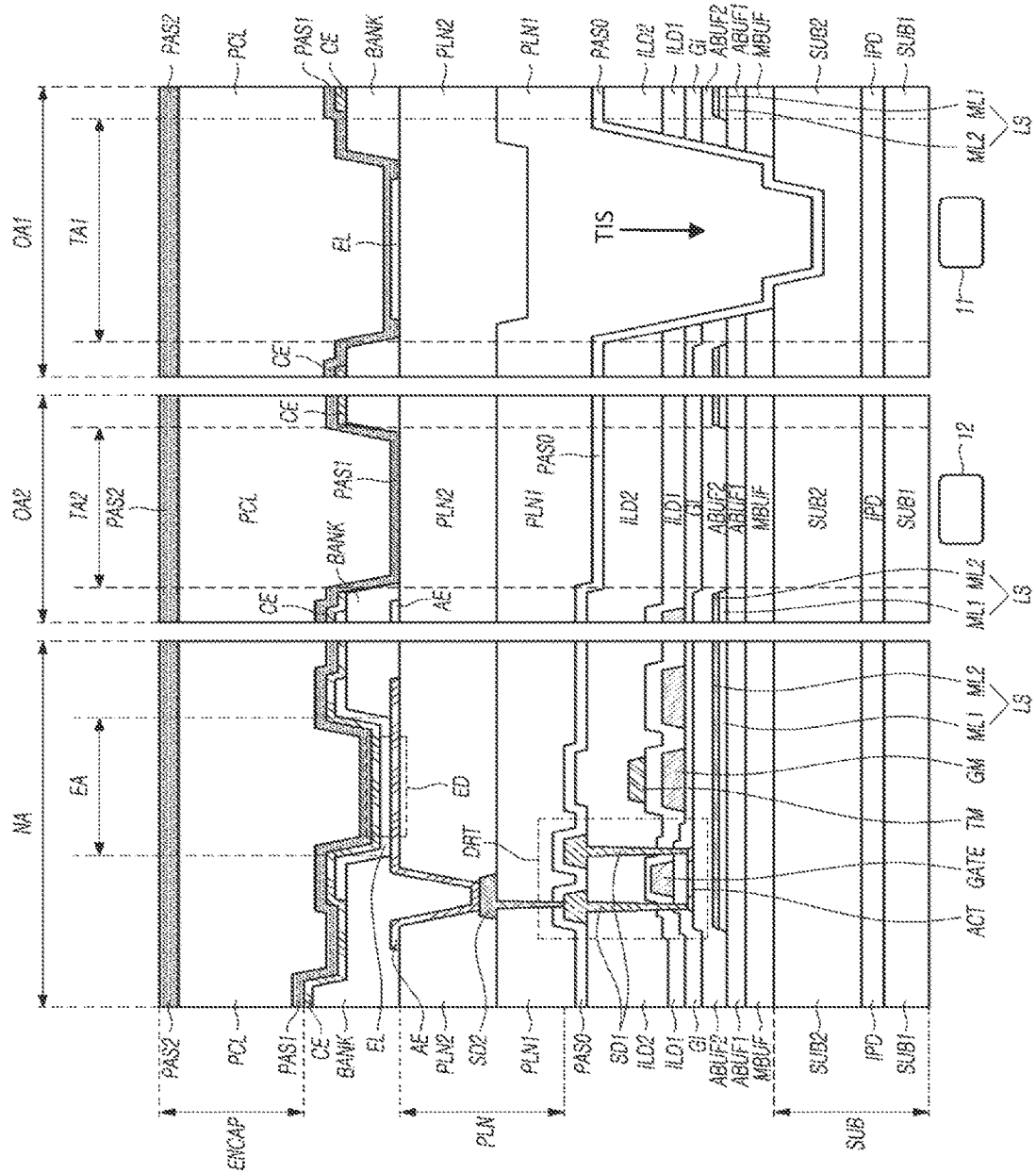
FIGS. 6 and 7 are example cross-sectional views of each of the first optical area, the second optical area, and the normal area included in the display area of the display panel according to embodiments of the present disclosure.
Figure 7:
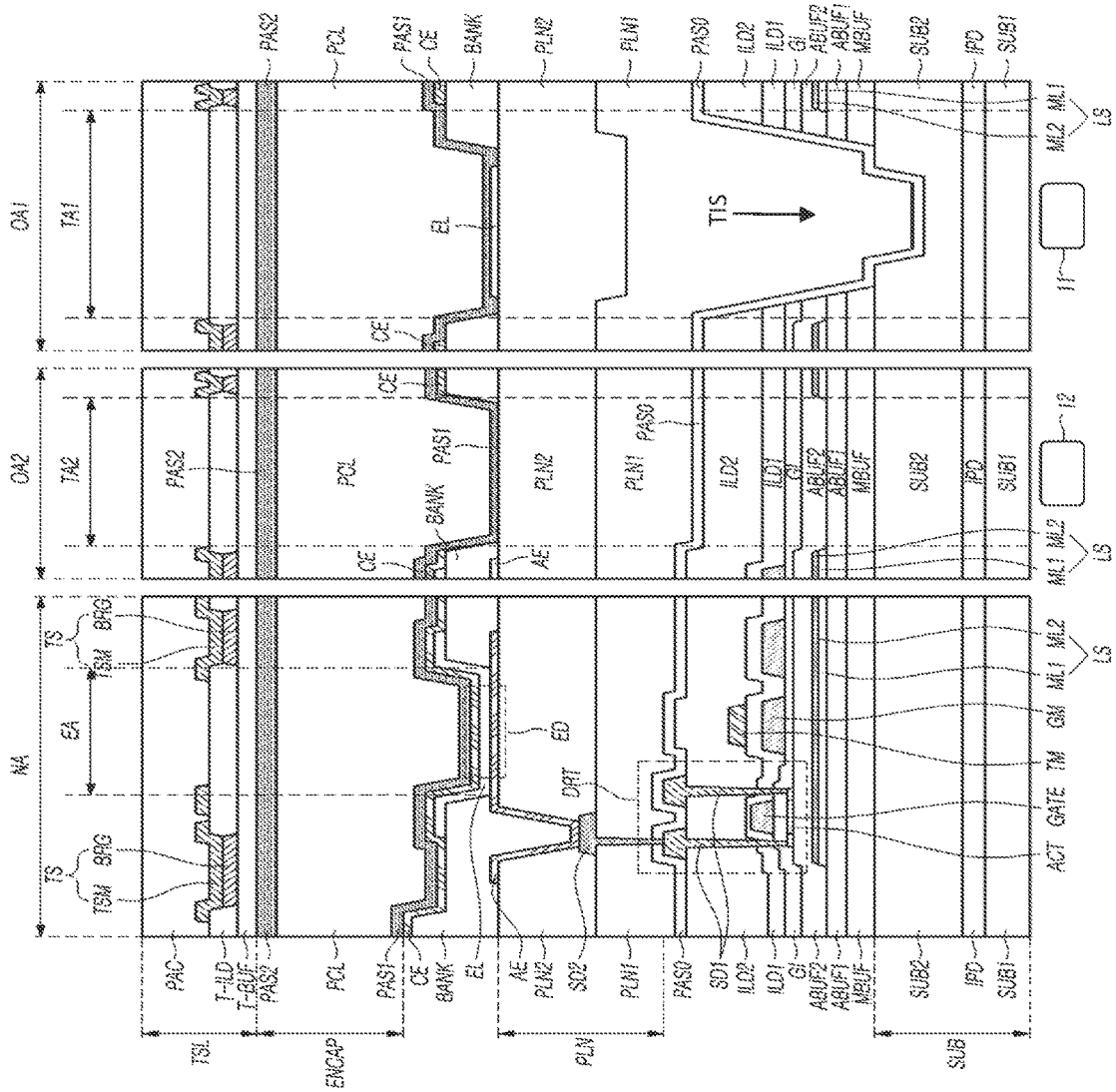

FIGS. 6 and 7 are example cross-sectional views of each of a first optical area (e.g., the first optical area OA1 in the figures discussed above), a second optical area (e.g., the second optical area OA2 in the figures discussed above), and a normal area (e.g., the normal area NA in the figures discussed above) included in the display area DA of the display panel 110 according to embodiments of the present disclosure.

FIG. 6 illustrates a display panel (e.g., the display panel 110 in the figures discussed above) in an example where a touch sensor is present outside of the display panel 110 in the form of a touch panel. FIG. 7 illustrates a display panel (e.g., the display panel 110 in the figures discussed above) in an example where a touch sensor TS is present inside of the display panel 110.

Each of FIGS. 6 and 7 shows example cross-sectional views of the normal area NA, the first optical area OA1, and the second optical area OA2 included in the display area DA.

First, a stack structure of the normal area NA will be described with reference to FIGS. 6 and 7. Respective light emitting areas EA of the first optical area OA1 and the second optical area OA2 may have the same stack structure as a light emitting area EA of the normal area NA.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed to cover the active layer ACT.

A gate electrode GATE of the driving transistor DRT may be disposed on the gate insulating layer GI. Further, a gate material layer GM may be disposed on the gate insulating layer GI, together with the gate electrode GATE of the driving transistor DRT, at a location different from the location where the driving transistor DRT is disposed.

A first interlayer insulating layer ILD1 may be disposed to cover the gate electrode GATE and the gate material layer GM. A metal pattern TM may be disposed on the first interlayer insulating layer ILD1. The metal pattern TM may be located at a location different from the location where the driving transistor DRT is formed. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be disposed to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the pixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

According to an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corresponding to a light emitting area EA of the pixel SP may be opened.

A portion of the anode electrode AE may be exposed through an opening (the opened portion) of the bank BANK. An emission layer EL may be disposed on side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE, as described above. The emission layer EL may include an organic material layer.

An encapsulation layer ENCAP may be disposed on the stack of the light emitting element ED.

The encapsulation layer ENCAP may have a single-layer structure or a multi-layer structure. For example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic material layer, and the second encapsulation layer PCL may be, for example, an organic material layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride (SiNx), silicon oxide (SiOx), silicon oxynitride (SiON), aluminum oxide (Al2O3), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet technique.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can reduce or prevent external moisture or oxygen from penetrating into the first encapsulation layer PAS1 and the second encapsulation layer PCL. For example, the third encapsulation layer PAS2 may include an inorganic insulating material, such as silicon nitride (SiNx), silicon oxide (SiO$_x$), silicon oxynitride (SiON), aluminum oxide (Al$_2$O$_3$), or the like.

Referring to FIG. 7, in an example where a touch sensor TS is embedded into the display panel 110, a touch sensor layer TSL including the touch sensor TS may be disposed on the encapsulation layer ENCAP. The structure of the touch sensor layer will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel 110, a chemical solution (e.g., a developer or etchant) used in the corresponding process or moisture from the outside may be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

In order to prevent or at least reduce damage to the emission layer EL including an organic material, which is vulnerable to high temperatures, the touch buffer layer T-BUF can be formed at a low temperature less than or equal to a predetermined temperature (e.g., 100 degrees C. (° C.)) and be formed using an organic insulating material having a low permittivity of 1 to 3. For example, the touch buffer layer T-BUF may include an acrylic-based, epoxy-based, or silicon-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

Referring to FIGS. 6 and 7, the light emitting area EA of the first optical area OA1 may have the same stack structure as that in the normal area NA. Accordingly, in the discussion that follows, instead of repeatedly describing the light emitting area EA of the first optical area OA1, a stack structure of the first transmission area TA1 of the first optical area OA1 will be described in detail below.

In some embodiments, the cathode electrode CE may be disposed in the light emitting areas EA included in the normal area NA and the first optical area OA1, but may not be disposed in the first transmission area TA1 in the first optical area OA1. For example, the first transmission area TA1 of the first optical area OA1 may correspond to an opening of the cathode electrode CE.

Further, in some embodiments, a light shield layer LS including at least one of the first metal layer ML1 and the second metal layer ML2 may be disposed in the light emitting areas EA included in the normal area NA and the first optical area OA1, but may not be disposed in the first transmission area TA1 of the first optical area OA1. For example, the first transmission area TA1 of the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, in some embodiments, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Referring to FIGS. 6 and 7, in some embodiments, the anode electrode AE and the cathode electrode CE included in the light emitting element ED may not be disposed in the first transmission area TA1. In some embodiments, the emission layer EL of the light emitting element ED may or may not be disposed in the first transmission area TA1 according to a design requirement.

Further, referring to FIG. 7, in some embodiments, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desired to further increase a transmittance of the first transmission area TA1 in the first optical area OA1.

To achieve the foregoing, in the display panel 110 of the display device 100 according to aspects of the present disclosure, a transmittance improvement structure TIS can be provided to the first transmission area TA1 in the first optical area OA1.

Referring to FIGS. 6 and 7, the plurality of insulating layers included in the display panel 110 may include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like.

Referring to FIG. 7, the plurality of insulating layers included in the display panel 110 may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure TIS.

Referring to FIGS. 6 and 7, among the plurality of insulating layers, the first planarization layer PLN1 may include at least one depression (e.g., a recess, a trench, a concave portion, a protrusion, or the like). The first planarization layer PLN1 may be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 may also have a depressed portion that extends downward from the surface thereof. In this embodiment, the second encapsulation layer PCL can substantially serve to provide planarization.

Referring to FIGS. 6 and 7, the depressed portions of the first planarization layer PLN1 and the passivation layer PAS0 may pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof. The second encapsulation layer PCL may be, for example, an organic insulating layer.

Referring to FIG. 7, to protect the touch sensor TS, the protective layer PAC may be disposed to cover the touch sensor TS on the encapsulation layer ENCAP.

Referring to FIG. 7, the protective layer PAC may have at least one depression (e.g., a recess, a trench, a concave portion, a protrusion, or the like) as a transmittance improvement structure TIS in a portion overlapping the first transmission area TA1. The protective layer PAC may be, for example, an organic insulating layer.

Referring to FIG. 7, the touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to the light emitting area EA of the pixel SP.

In order for the first optical area OA1 to have a transmittance greater than the normal area NA, an area or size of the touch sensor metal TSM per unit area in the first optical area OA1 may be smaller than an area or size of the touch sensor metal TSM per unit area in the normal area NA.

Referring to FIG. 7, in some embodiments, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

Referring to FIGS. 6 and 7, the light emitting area EA of the second optical area OA2 may have the same stack structure as that of the normal area NA. Accordingly, in the discussion that follows, instead of repeatedly describing the light emitting area EA in the second optical area OA2, a stack structure of the second transmission area TA2 in the second optical area OA2 will be described in detail below.

In some embodiments, the cathode electrode CE may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the cathode electrode CE.

In an embodiment, the light shield layer LS including at least one of the first metal layer ML1 and the second metal layer ML2 may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the light shield layer LS.

In an example where the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 may be different at least in part from as the stacked structure of the first transmission area TA1 in the first optical area OA1.

For example, as shown in FIGS. 6 and 7, in some embodiments, when the transmittance of the second optical area OA2 is lower than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. In an embodiment, a width of the second transmission area TA2 in the second optical area OA2 may be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 may be disposed in the second transmission area TA2 of the second optical area OA2 equally, substantially equally, or similarly.

However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 6 and 7, in some embodiments, the anode electrode AE and the cathode electrode CE included in the light emitting element ED may not be disposed in the second transmission area TA2. In some embodiments, the emission layer EL of the light emitting element ED may or may not be disposed in the second transmission area TA2 of the second optical area OA2.

Further, referring to FIG. 7, in some embodiments, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
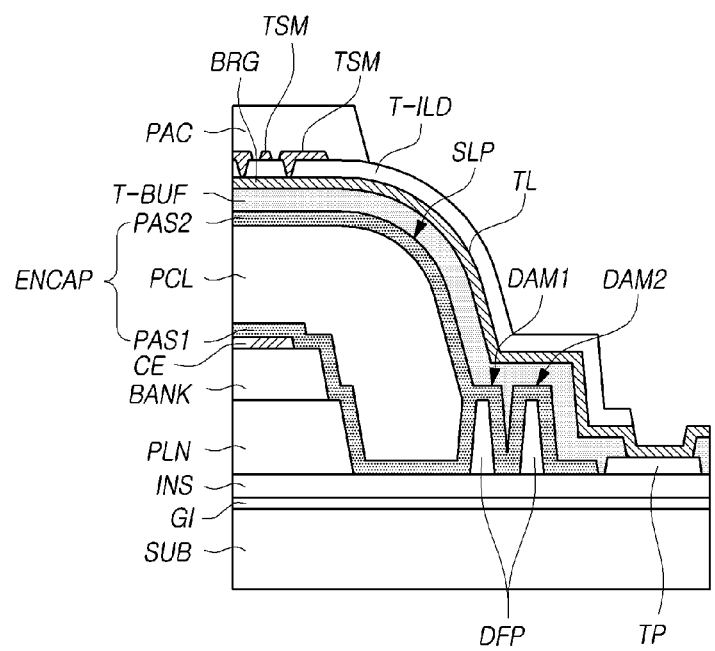
FIG. 8 is an example cross-sectional view of an edge of a display panel according to embodiments of the present disclosure.

FIG. 8 is an example cross-sectional view of an outer edge of the display panel 110 according to embodiments of the present disclosure.

For the sake of brevity, in FIG. 8, a single substrate SUB including the first substrate SUB1 and the second substrate SUB2 is illustrated, and layers or portions located under the bank BANK are illustrated in a simplified structure. In the same manner, FIG. 8 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 8, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1.

The third encapsulation layer PAS2 can minimize or prevent external moisture or oxygen from penetrating into the first encapsulation layer PAS1 and the second encapsulation layer PCL.

Referring to FIG. 8, in order to prevent the encapsulation layer ENCAP from collapsing, the display panel 110 may include one or more dams (DAM1, DAM2) at, or near to, an end or edge of an inclined surface SLP of the encapsulation layer ENCAP. The one or more dams (DAM1 and/or DAM2) may be present at, or near to, a boundary point between the display area DA and the non-display area NDA.

The one or more dams (DAM1 and/or DAM2) may include the same material DFP as the bank BANK.

Referring to FIG. 8, in one embodiment, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1 and DAM2). In another embodiment, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another embodiment, the second encapsulation layer PCL may extend past the upper portion of the first dam DAM1 and extend up to all, or at least a portion of, an upper portion of the secondary dam DAM2.

Referring to FIG. 8, a touch pad TP, to which the touch driving circuit 260, as shown in FIG. 2, is electrically connected, may be disposed on a portion of the substrate SUB outside of the one or more dams (DAM1 and/or DAM2).

A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP.

The touch line TL may run downward along the inclined surface SLP of the encapsulation layer ENCAP, run along the respective upper portions of the one or more dams (DAM1 and/or DAM2), and extend up to the touch pad TP disposed outside of the one or more dams (DAM1 and/or DAM2).

Referring to FIG. 8, in one embodiment, the touch line TL may be the bridge metal BRG. In another embodiment, the touch line TL may be the touch sensor metal TSM.

FIGS. 9 to 14 are example cross-sectional views of a normal area, a first optical area, and a second optical area included in a display area of the display panel according to embodiments of the present disclosure.

There has been a problem in which image quality of a display device is reduced as the display device has a relatively high reflectance. Attempts to locate a polarizing plate have been made to improve the image quality by reducing the reflectance. In turn, the application of the polarizing plate has caused a decrease in luminous efficiency due to a low front transmittance, and in particular, has caused the problem of lowering transmittance in implementing an under-display camera (UDC) technique in display devices.

To address these issues, a structure of disposing a transmittance control layer on or under a touch sensor layer to control the transmittance of light emitted from a light source disposed in a display device (e.g., the display device 100 discussed above) is disclosed.

In FIGS. 9 to 14, for convenience of description, elements disposed under an encapsulation layer ENCAP are not illustrated, and the stack structure under the encapsulation layer ENCAP illustrated in FIGS. 6 and 7 may be equally or substantially equally applied to FIGS. 9 to 14. Further, in discussing configurations related to the encapsulation layer ENCAP and a touch sensor layer TSL, unless otherwise specified, the stack structures of FIGS. 6 and 7 may be equally or substantially equally applied to FIGS. 9 to 14 without providing detailed discussions for convenience of description.

Figure 9:
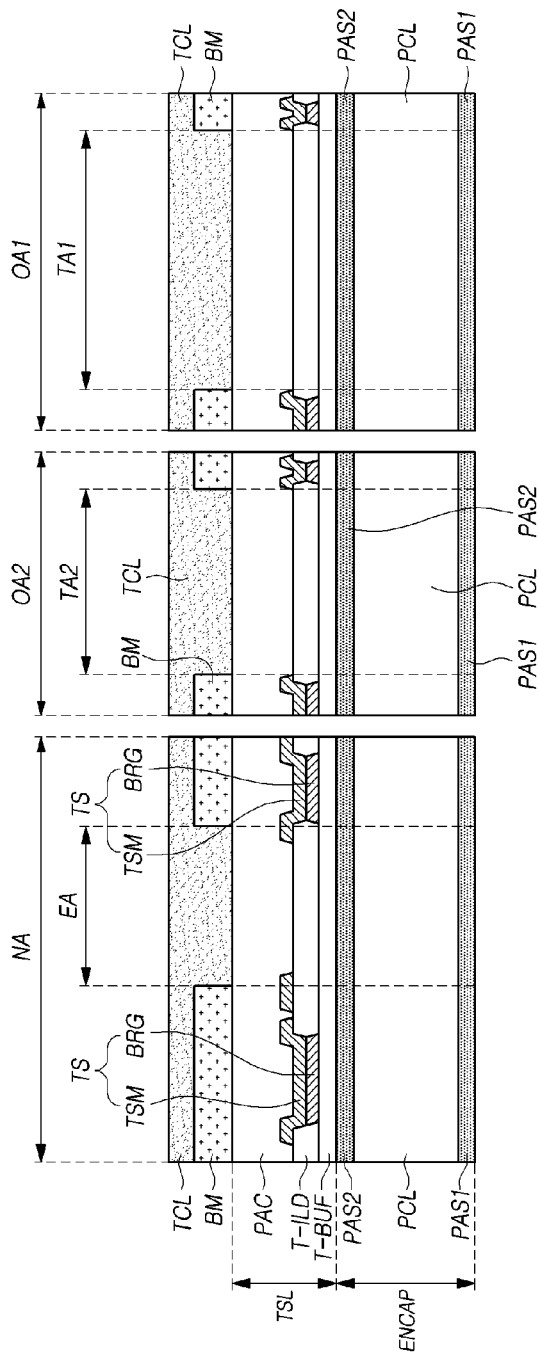
FIGS. 9 to 14 are example cross-sectional views of a normal area, a first optical area, and a second optical area included in a display area of the display panel according to embodiments of the present disclosure.
Figure 10:
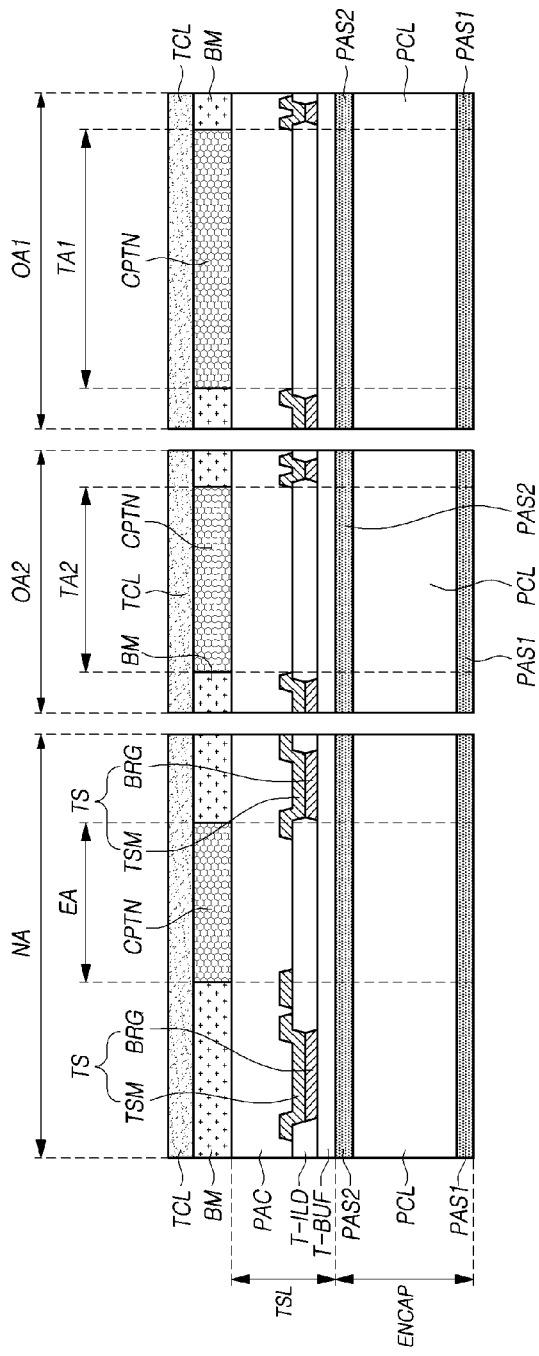

Referring to FIGS. 9 and 10, the display device 100 according to aspects of the present disclosure may include the substrate SUB, an encapsulation layer ENCAP disposed over the substrate SUB, a touch sensor layer TSL disposed on the encapsulation layer ENCAP and including a plurality of touch sensors TS, and a transmittance control layer TCL disposed on the touch sensor layer TSL.

The transmittance control layer TCL may be disposed on the touch sensor layer TSL. The transmittance control layer TCL may be disposed in the normal area NA and the optical areas (OA1 and OA2). The transmittance control layer TCL may be configured to control the transmittance of incident light emitted from a light source, and reduce the reflectance of external light.

The transmittance control layer TCL may include an organic insulating material, and may be formed, for example, using an inkjet technique.

The transmittance control layer TCL may have a transmittance of 0 to 50% in a wavelength region of 550 nm in one embodiment. In an embodiment, the transmittance control layer TCL may have a spectrum in which transmittance in the wavelength region of green light is less than respective transmittance in the wavelength regions of red and blue light.

A black matrix BM may be disposed on the touch sensor layer TSL. The black matrix BM may be disposed to overlap an area in which the plurality of touch sensors TS are disposed. The black matrix BM may include an organic insulating material. In an embodiment, the black matrix BM may include a black material, and thereby, be configured to absorb light in order to prevent or at least reduce the occurrence of a color mixture as light emitted from a light source enters an adjacent subpixel. The black matrix BM may be configured to reduce the reflectance of external light.

The transmittance control layer TCL may be disposed to cover the touch sensor layer TSL and the black matrix BM disposed on the touch sensor layer TSL. As the transmittance control layer TCL is disposed to cover the touch sensor layer TSL and the black matrix BM, the transmittance control layer TCL can also serve as a planarization layer.

Referring to FIG. 10, a clear pattern CPTN may be disposed between black matrices BM or two portions of the black matrix BM, on the touch sensor layer TSL. The clear pattern CPTN may include a transparent organic insulating material, and may be formed, for example, using an inkjet technique.

The clear pattern CPTN may be disposed in an area of a green subpixel among subpixels. The clear pattern CPTN may be disposed in transmission areas (TA1 and TA2) of the optical areas (OA1 and OA2). In an example where the clear pattern CPTN is disposed between the black matrices BM or the two portions of the black matrix BM, the transmittance control layer TCL may be disposed to cover the clear pattern CPTN and the black matrices BM or the two portions of the black matrix BM.

The thickness of a portion of the transmittance control layer TCL formed between the black matrices BM or the two portions of the black matrix BM can be adjusted by controlling the thickness of the clear pattern CPTN. For example, the portion of the transmittance control layer TCL disposed on the upper surface of the clear pattern CPTN may be thinner than the thickness of a portion of the transmittance control layer TCL corresponding to an area where the clear pattern CPTN is not disposed. Transmittance can be controlled by adjusting the thickness of the transmittance control layer TCL.

The transmittance control layer TCL may be disposed for each subpixel of the normal area NA, and may be disposed in transmission areas (TA1 and TA2). The clear pattern CPTN may be disposed for each subpixel of the normal area NA, and may be disposed in transmission areas (TA1 and TA2). The transmittance control layer TCL and the clear pattern CPTN may be formed separately or may be disposed to overlap each other. For example, the clear pattern CPTN may be disposed in a green subpixel of the normal area NA, while only the transmittance control layer TCL may be disposed in red and blue subpixels thereof. In an embodiment, the clear pattern CPTN may be disposed in one or more transmission areas (TA1 and/or TA2), while only the transmittance control layer TCL may be disposed in one or more other transmission areas (TA1 and/or TA2), among a plurality transmission areas (TA1 and/or TA2).

Figure 11:
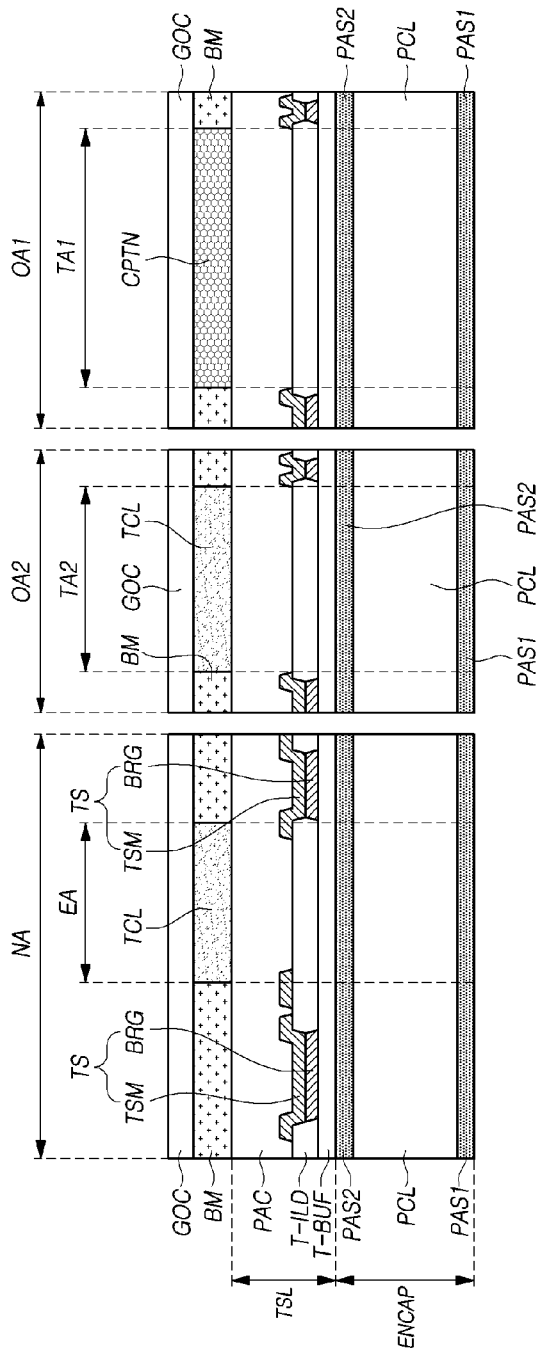
Figure 12:
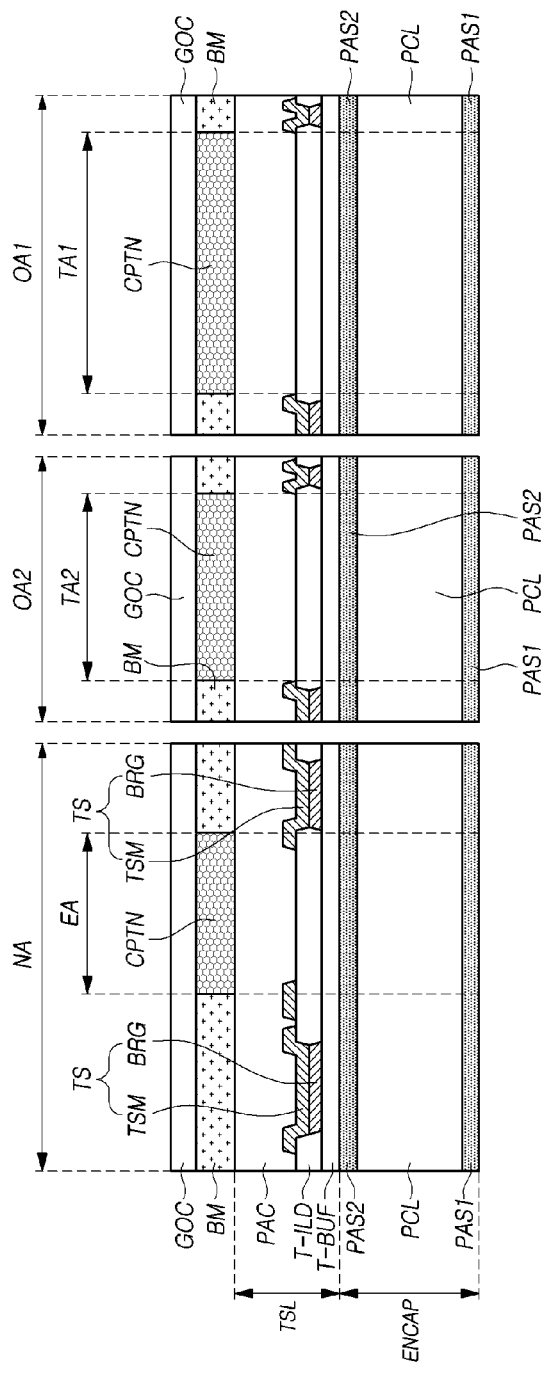

Referring to FIGS. 11 and 12, the display device 100 according to embodiments of the present disclosure may further include an overcoat layer GOC.

A transmittance control layer TCL may be disposed between black matrices BM, or two portions of a black matrix BM, on the touch sensor layer TSL, and a clear pattern CPTN may be disposed between black matrices BM, or two portions of a black matrix BM, on the touch sensor layer TSL. In this example, the overcoat layer GOC may be disposed on the transmittance control layer TCL, the black matrices BM, and the clear pattern CPTN.

The transmittance control layer TCL may be disposed for each subpixel of the normal area NA, and may be disposed in transmission areas (TA1 and TA2). The clear pattern CPTN may be disposed for each subpixel of the normal area NA, and may be disposed in transmission areas (TA1 and TA2). For example, the clear pattern CPTN may be disposed in a green subpixel of the normal area NA, while only the transmittance control layer TCL may be disposed in red and blue subpixels thereof. In an embodiment, the clear pattern CPTN may be disposed in one or more transmission areas (TA1 and/or TA2), while only the transmittance control layer TCL may be disposed in one or more other transmission areas (TA1 and/or TA2), among a plurality transmission areas (TA1 and/or TA2).

The remaining description of the transmittance control layer TCL and the clear pattern CPTN is substantially the same as the foregoing description of FIGS. 9 and 10; therefore, such description will be omitted.

The overcoat layer GOC may have an opaque color. For example, the overcoat layer GOC may have a gray color. In an embodiment, the color of the overcoat layer GOC may be a color different from the black color. The overcoat layer GOC may serve to flatten the surface of the substrate on which the black matrices BM, the transmittance control layer TCL, and the clear pattern CPTN are disposed, and further serve to reduce the reflectance of the display device 100 for external light without including a polarization layer, in turn, enabling visibility to be improved.

Figure 13:
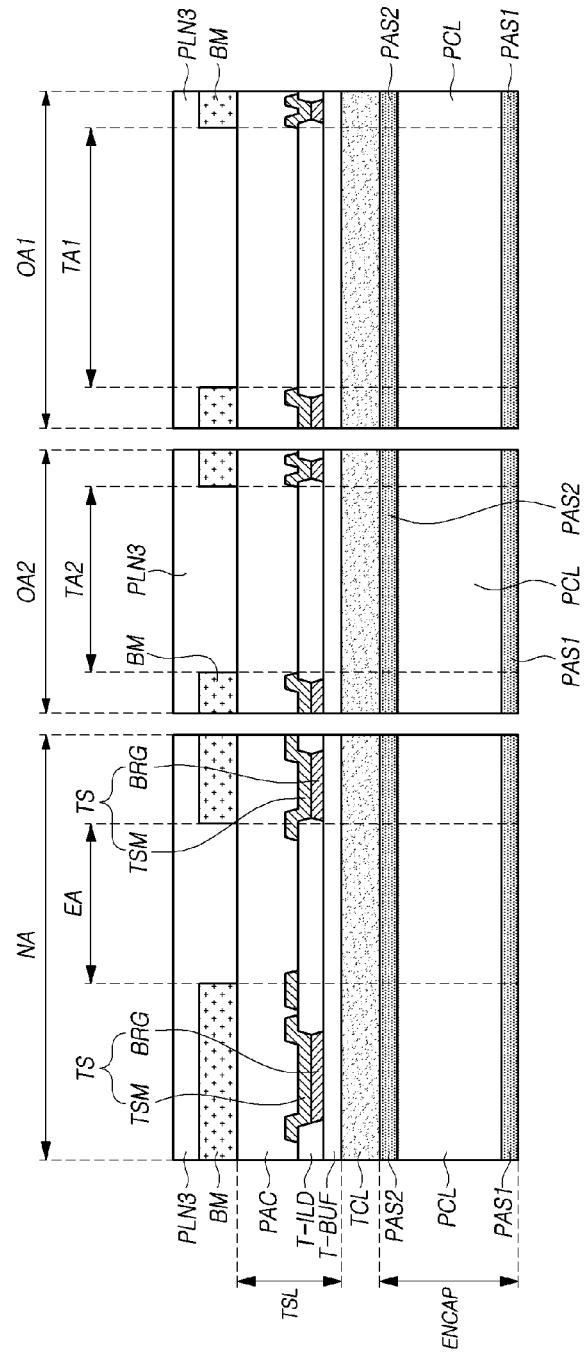
Figure 14:
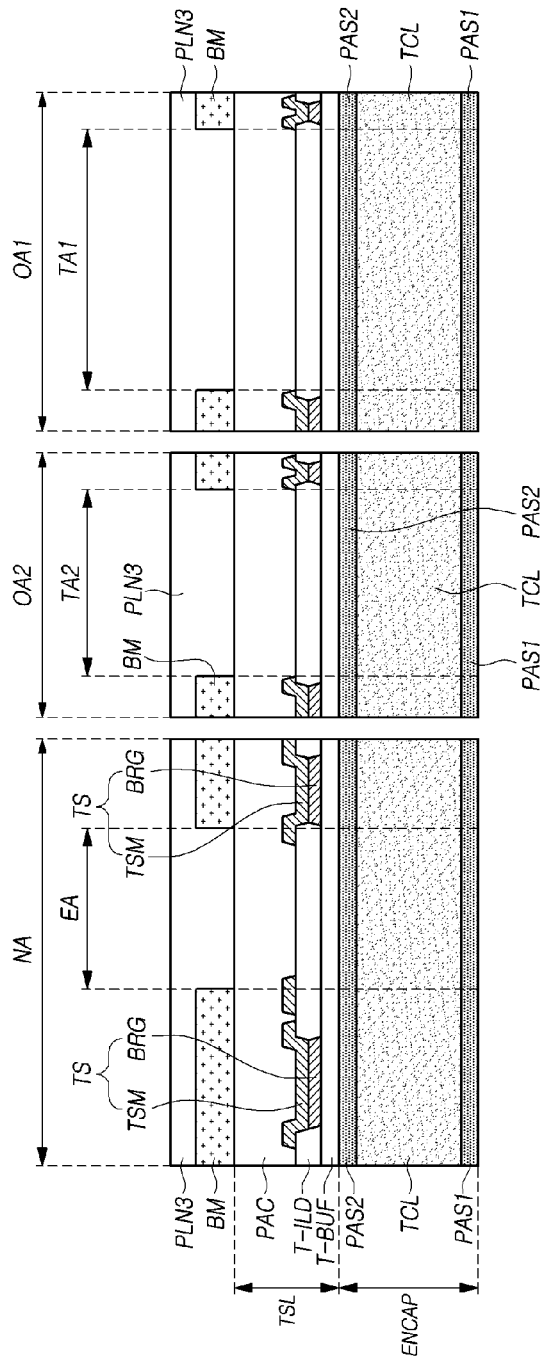

Referring to FIGS. 13 and 14, the display device 100 according to embodiments of the present disclosure may include the substrate SUB, an encapsulation layer ENCAP disposed over the substrate SUB, a touch sensor layer TSL disposed on the encapsulation layer ENCAP and including a plurality of touch sensors TS, and a transmittance control layer TCL disposed under the touch sensor layer TSL.

In an example where the transmittance control layer TCL is disposed under the touch sensor layer TSL, a planarization layer PLN3 may be disposed on the touch sensor layer TSL.

The transmittance control layer TCL may be disposed between the touch sensor layer TSL and the encapsulation layer ENCAP.

In an embodiment, the transmittance control layer TCL may be disposed between a first encapsulation layer PAS1 and a third encapsulation layer PASS of the encapsulation layer ENCAP. In this example, since the transmittance control layer TCL serves as a second encapsulation layer PCL, the second encapsulation layer PCL may be removed.

Figure 15:
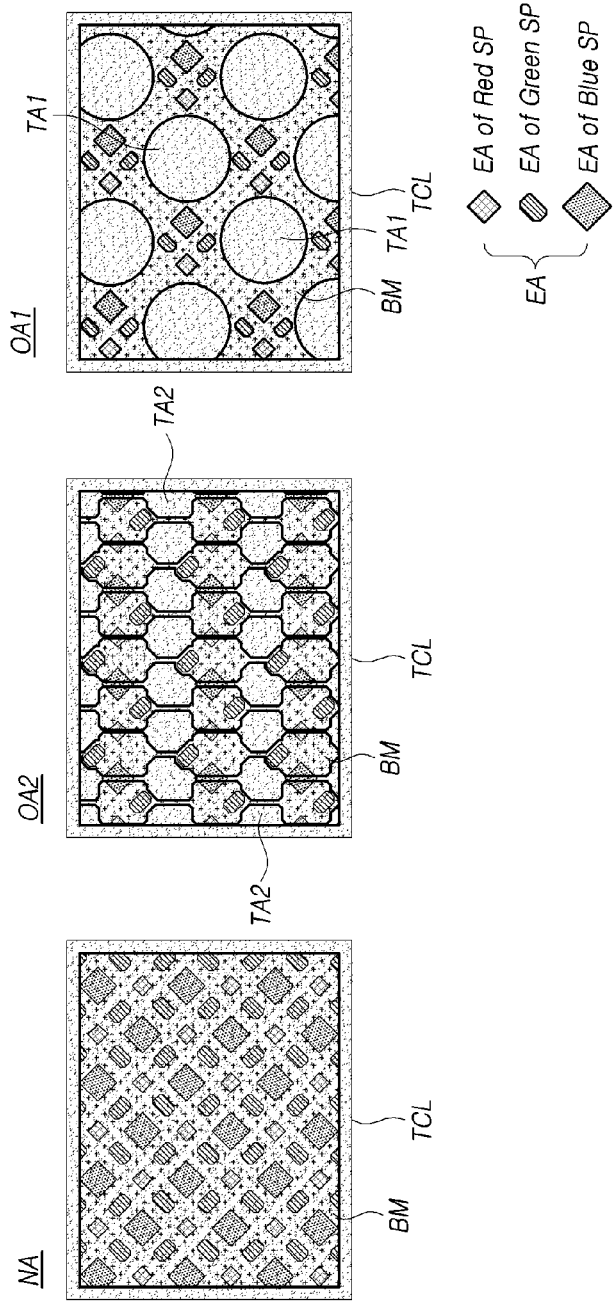
FIGS. 15 to 17 illustrate example arrangements of pixels in the three area included in a display area of the display panel according to embodiments of the present disclosure.
Figure 16:
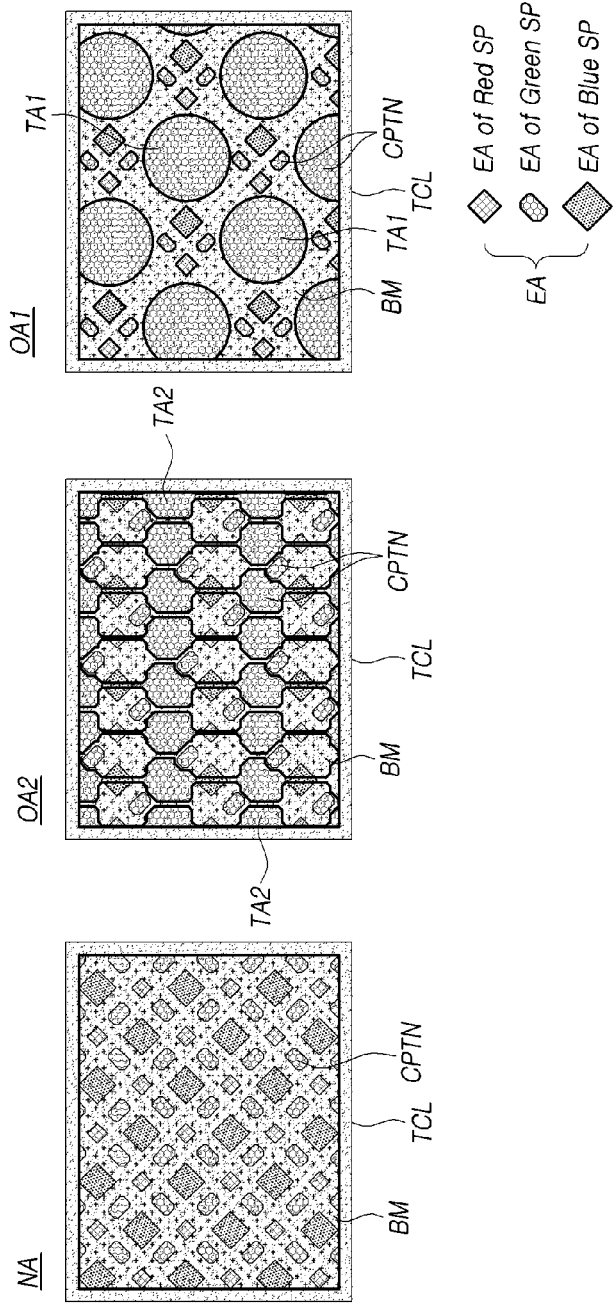
Figure 17:
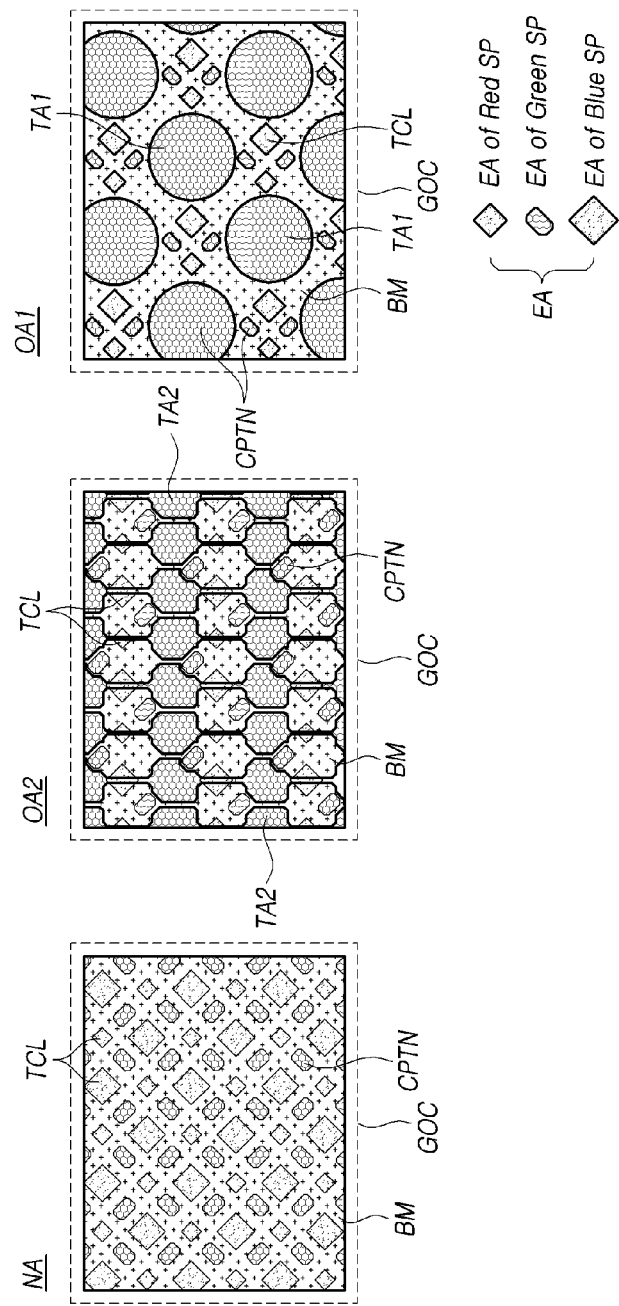

FIGS. 15 to 17 illustrate example arrangements of pixels in three areas (e.g., the normal area NA, the first optical area OA1, and the second optical area OA2 in the figures discussed above) included in the display area of the display panel 110 according to embodiments of the present disclosure.

Referring to FIG. 15, a transmittance control layer TCL may be disposed in the entire area of the normal area NA and the optical areas (OA1 and OA2).

Referring to FIG. 16, a clear pattern CPTN and a transmittance control layer TCL may be disposed to overlap each other in green subpixels EA of the normal area NA, and the transmittance control layer TCL may be disposed in red subpixels, blue subpixels, and black matrices BM thereof. A clear pattern CPTN and a transmittance control layer TCL may be disposed to overlap each other in green subpixels EA and transmission areas (TA1 and TA2) of the optical areas (OA1 and OA2), and the transmittance control layer TCL may be disposed in red subpixels, blue subpixels, and black matrices BM thereof.

Referring to FIG. 17, a clear pattern CPTN may be disposed in green subpixels EA of the normal area NA, and a transmittance control layer TCL may be disposed in red subpixels and blue subpixels thereof. A clear pattern CPTN may be disposed in green subpixels EA and transmission areas (TA1 and TA2) of the optical areas (OA1 and OA2), and a transmittance control layer TCL may be disposed in red subpixels and blue subpixels thereof. In an embodiment, an overcoat layer GOC may be disposed in the entire area of the normal area NA and the optical areas (OA1 and OA2) to be planarized.

Figure 18:
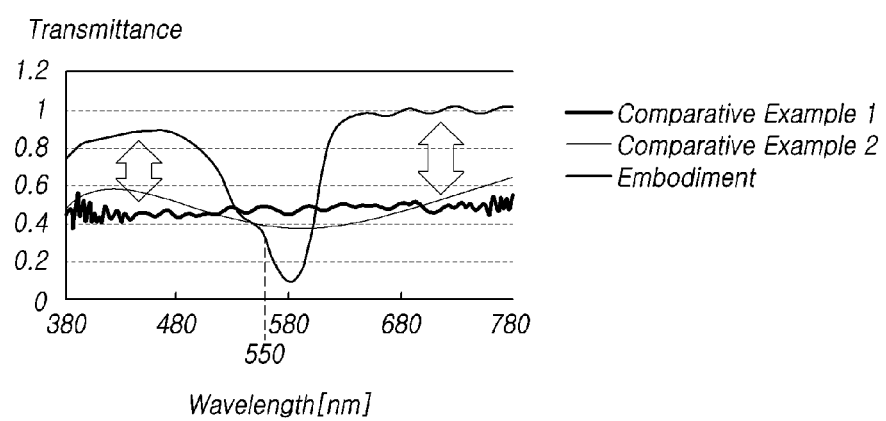
FIG. 18 is a graph illustrating transmittance versus wavelength according to whether a transmittance control layer is applied or not in the display device according to embodiments of the present disclosure.

FIG. 18 is a graph illustrating transmittance versus wavelength according to whether the transmittance control layer TCL is applied or not in the display device 100 according to embodiments of the present disclosure.

Figure 19:
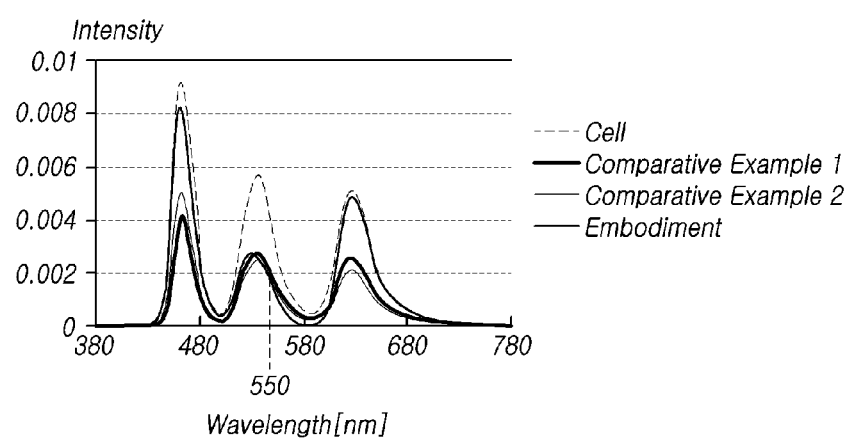
FIG. 19 is a graph illustrating light transmittance intensity versus wavelength according to whether a transmittance control layer is applied or not in the display device according to embodiments of the present disclosure.

FIG. 19 is a graph illustrating light transmittance intensity versus wavelength according to whether the transmittance control layer TCL is applied or not in the display device 100 according to embodiments of the present disclosure.

In FIGS. 18 and 19, Comparative Example 1 represents a display device to which a conventional polarization layer is applied, Comparative Example 2 represents a display device to which a planarization layer formed using a conventional low-temperature curing ink is applied, and Embodiments represent the display device 100 according to aspects of the present disclosure to which the transmittance control layer TCL according to the embodiments described herein is applied.

Referring to FIG. 18, it can be observed that in the display device 100 according to the Embodiment as compared to the display devices according to Comparative Examples 1 and 2, the transmittance of light emitted from a light source in the wavelength region of blue light and the transmittance of red light in the wavelength region of red light is significantly improved. Further, it can be observed that the transmittance of light emitted from the light source in the wavelength region of green light, for example, the wavelength of 550 nm, is reduced by about 36%.

Referring to FIG. 19, it can be observed that in the display device 100 according to the Embodiment as compared to the display devices according to Comparative Examples 1 and 2, the respective light emitting intensity of blue light and red light are significantly improved, and the light emitting intensity of green light represents an equivalent level in the wavelength of 550 nm.

As a result, in the display device 100, the respective transmittance of blue light and red light are significantly improved, resulting in luminous efficiency being improved, and while the transmittance of green light is reduced, since the reflectance of the green light is also reduced, corresponding luminous efficiency can be maintained at the same level without being reduced. In addition, in an example where the improved luminous efficiency for blue light and red light is reduced a level equivalent to luminous efficiency of the display devices to which the embodiments of the present disclosure are not applied, an advantage of reducing a driving voltage can be provided.

According to the one or more embodiments described herein, a display device (e.g., the display device 100 discussed above) can be provided that is capable of improving image quality by controlling transmittance according to red, blue and green wavelength regions in such a manner as to increase respective transmittance in the blue light region and the red light region to improve light transmittance, and to reduce transmittance in the green light region to reduce reflectance.

According to the one or more embodiments described herein, a display device (e.g., the display device 100 discussed above) can be provided that is capable of improving image quality through a reduced reflectance by implementing both a black matrix and a transmittance control layer.

According to the one or more embodiments described herein, a display device (e.g., the display device 100 discussed above) can be provided that is capable of improving luminous efficiency and image quality even when a polarization layer is removed from the display device.

According to the one or more embodiments described herein, a display device (e.g., the display device 100 discussed above) can be provided that is capable of improving flexibility by applying a transmittance control layer thinner than a polarization layer, According to the one or more embodiments described herein, a display device (e.g., the display device 100 discussed above) can be provided that is capable of improving luminous efficiency and image quality and reducing a driving voltage.

According to the one or more embodiments described herein, a display device (e.g., the display device 100 discussed above) can be provided that is capable of improving the transmittance of an area in which a camera is located under a display area of the display device.

The embodiments of the present disclosure described above have been described for illustrative purposes; those skilled in the art will appreciate that various modifications, additions and substitutions are possible, without departing from the scope and spirit of the invention as disclosed in the accompanying claims. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display panel comprising:
    a substrate;
    an encapsulation layer over the substrate;
    a touch sensor layer on the encapsulation layer, the touch sensor layer comprising a plurality of touch sensors; and
    a transmittance control layer on the touch sensor layer,
    wherein the transmittance control layer has a transmittance of 0 to 50% in a 550 nm wavelength.

2. The display panel according to claim 1, further comprising:
    a black matrix on the touch sensor layer, the black matrix overlapping an area that includes the plurality of touch sensors.

3. The display panel according to claim 2, wherein the transmittance control layer is on the black matrix.

4. The display panel according to claim 2, further comprising:
    a clear pattern between black matrix or two portions of the black matrix.

5. The display panel according to claim 4, further comprising:
    an overcoat layer on the black matrix or the two portions of the black matrix and the clear pattern.

6. The display panel according to claim 1, wherein the transmittance control layer is under the touch sensor layer.

7. The display panel according to claim 6, wherein the transmittance control layer is between the touch sensor layer and the encapsulation layer.

8. The display panel according to claim 6, wherein the encapsulation layer comprises a first encapsulation layer and a second encapsulation layer, and
    wherein the transmittance control layer is between the first encapsulation layer and the second encapsulation layer.

9. The display panel according to claim 6, further comprising:
    a planarization layer on the touch sensor layer.

10. The display panel according to claim 4, wherein the substrate comprises a red subpixel, a green subpixel, and a blue subpixel, and the clear pattern is in an area of the green subpixel.

11. The display panel according to claim 4, wherein the substrate comprises an optical area comprising a transmission area, and the clear pattern is in the transmission area.

12. The display panel according to claim 1, wherein the transmittance control layer has a spectrum in which transmittance in a wavelength region of green light is less than respective transmittance in wavelength regions of red light and blue light.

13. A display panel comprising:
    a substrate including a red subpixel, a green subpixel, and a blue subpixel;
    an encapsulation layer over the substrate;

a touch sensor layer on the encapsulation layer, the touch sensor layer comprising a plurality of touch sensors; and a transmittance control layer configured to respectively control a transmittance of incident light emitted from light sources of the red subpixel, the green subpixel, and the blue subpixel, and reduce reflectance of external light, wherein the transmittance control layer has a transmittance of 0 to 50% in a 550 nm wavelength.

14. A display device comprising:

the display panel according to claim 1; and one or more optical electronic devices located under, or in a lower portion of the display panel.

15. The display device according to claim 14, wherein the display panel comprises a display area and a non-display area, and the display area comprises one or more optical areas and a normal area, and the one or more optical areas overlap the one or more optical electronic devices respectively.

16. The display device according to claim 15, wherein the transmittance control layer is differently configured for the one or more optical areas and the normal area.

* * * * *